(12) United States Patent
Amundson et al.

(10) Patent No.: US 7,116,318 B2
(45) Date of Patent: Oct. 3, 2006

(54) BACKPLANES FOR DISPLAY APPLICATIONS, AND COMPONENTS FOR USE THEREIN

(75) Inventors: Karl R. Amundson, Cambridge, MA (US); Yu Chen, Allston, MA (US); Kevin L. Denis, Beverly Farms, MA (US); Paul S. Drzaic, Morgan Hill, CA (US); Peter T. Kazlas, Sudbury, MA (US); Andrew P. Ritenour, Medford, MA (US)

(73) Assignee: E Ink Corporation, Cambridge, MA (US)

( * ) Notice: Subject to any disclaimer, the term of this patent is extended or adjusted under 35 U.S.C. 154(b) by 316 days.

(21) Appl. No.: 10/249,618

(22) Filed: Apr. 24, 2003

(65) Prior Publication Data

US 2003/0222315 A1    Dec. 4, 2003

Related U.S. Application Data

(60) Provisional application No. 60/375,571, filed on Apr. 24, 2002, provisional application No. 60/375,508, filed on Apr. 24, 2002.

(51) Int. Cl.
G09G 5/00 (2006.01)

(52) U.S. Cl. ............... 345/204; 345/205; 345/210; 345/214

(58) Field of Classification Search ......... 345/204, 345/30, 99, 605, 107, 87, 88, 596, 205, 210, 345/214, 690, 89, 92, 182; 438/200, 146, 438/455, 149, 141, 158; 359/296, 245; 340/784; 349/78, 139, 88, 158; 313/506, 511; 427/213.3; 257/168, 213
See application file for complete search history.

(56) References Cited

U.S. PATENT DOCUMENTS

| | | | |
|---|---|---|---|
| 3,668,106 A | 6/1972 | Ota | |
| 3,756,693 A | 9/1973 | Ota | |
| 3,767,392 A | 10/1973 | Ota | |
| 3,792,308 A | 2/1974 | Ota | |
| 3,870,517 A | 3/1975 | Ota et al. | |
| 3,892,568 A | 7/1975 | Ota | |
| 4,068,927 A | 1/1978 | White | |
| 4,418,346 A | 11/1983 | Batchelder | |
| 5,177,475 A * | 1/1993 | Stephany et al. | ............. 345/96 |
| 5,238,861 A | 8/1993 | Morin et al. | |
| 5,614,427 A | 3/1997 | den Boer et al. | |

(Continued)

FOREIGN PATENT DOCUMENTS

DE    41 08 818 A1    9/1992

(Continued)

OTHER PUBLICATIONS

Amundson, K., et al., "Flexible, Active-Matrix Display Constructed Using a Microencapsulated Electrophoretic Material and an Organic-Semiconductor-Based Backplane", SID 01 Digest, 160 (Jun. 2001).

(Continued)

*Primary Examiner*—Bipin Shalwala
*Assistant Examiner*—Prabodh Dharia
(74) *Attorney, Agent, or Firm*—David J. Cole

(57) ABSTRACT

A display pixel unit provides reduced capacitative coupling between a pixel electrode and a source line. The unit includes a transistor, the pixel electrode, and the source line. The source line includes an extension that provides a source for the transistor. A patterned conductive portion is disposed adjacent to the source line.

20 Claims, 21 Drawing Sheets

U.S. PATENT DOCUMENTS

| | | | |
|---|---|---|---|
| 5,672,524 A | 9/1997 | Liu et al. | |
| 5,715,026 A | 2/1998 | Shannon | |
| 5,721,164 A | 2/1998 | Wu | |
| 5,734,452 A | 3/1998 | Yamaue et al. | |
| 5,745,094 A | 4/1998 | Gordon, II et al. | |
| 5,760,761 A | 6/1998 | Sheridon | |
| 5,777,782 A | 7/1998 | Sheridon | |
| 5,808,783 A | 9/1998 | Crowley | |
| 5,847,413 A | 12/1998 | Yamazaki et al. | |
| 5,872,552 A | 2/1999 | Gordon, II et al. | |
| 5,930,026 A | 7/1999 | Jacobson et al. | |
| 5,961,804 A | 10/1999 | Jacobson et al. | |
| 6,017,584 A | 1/2000 | Albert et al. | |
| 6,027,958 A | 2/2000 | Vu et al. | |
| 6,054,071 A | 4/2000 | Mikkelsen, Jr. | |
| 6,055,091 A | 4/2000 | Sheridon et al. | |
| 6,067,185 A | 5/2000 | Albert et al. | |
| 6,097,531 A | 8/2000 | Sheridon | |
| 6,118,426 A | 9/2000 | Albert et al. | |
| 6,120,588 A | 9/2000 | Jacobson | |
| 6,120,839 A * | 9/2000 | Comiskey et al. | 427/213.3 |
| 6,124,851 A | 9/2000 | Jacobson | |
| 6,128,124 A | 10/2000 | Silverman | |
| 6,130,773 A | 10/2000 | Jacobson et al. | |
| 6,130,774 A | 10/2000 | Albert et al. | |
| 6,137,467 A | 10/2000 | Sheridon et al. | |
| 6,144,361 A | 11/2000 | Gordon, II et al. | |
| 6,147,791 A | 11/2000 | Sheridon | |
| 6,172,798 B1 | 1/2001 | Albert et al. | |
| 6,177,921 B1 | 1/2001 | Comiskey et al. | |
| 6,184,856 B1 | 2/2001 | Gordon, II et al. | |
| 6,225,971 B1 | 5/2001 | Gordon, II et al. | |
| 6,232,950 B1 | 5/2001 | Albert et al. | |
| 6,241,921 B1 | 6/2001 | Jacobson et al. | |
| 6,249,271 B1 | 6/2001 | Albert et al. | |
| 6,252,564 B1 | 6/2001 | Albert et al. | |
| 6,262,706 B1 | 7/2001 | Albert et al. | |
| 6,262,833 B1 | 7/2001 | Loxley et al. | |
| 6,271,823 B1 | 8/2001 | Gordon, II et al. | |
| 6,300,932 B1 | 10/2001 | Albert | |
| 6,301,038 B1 | 10/2001 | Fitzmaurice et al. | |
| 6,312,304 B1 | 11/2001 | Duthaler et al. | |
| 6,312,971 B1 | 11/2001 | Amundson et al. | |
| 6,323,034 B1 | 11/2001 | Chen et al. | |
| 6,323,989 B1 | 11/2001 | Jacobson et al. | |
| 6,327,072 B1 | 12/2001 | Comiskey et al. | |
| 6,376,828 B1 | 4/2002 | Comiskey | |
| 6,377,387 B1 | 4/2002 | Duthaler et al. | |
| 6,392,785 B1 | 5/2002 | Albert et al. | |
| 6,392,786 B1 | 5/2002 | Albert | |
| 6,413,790 B1 | 7/2002 | Duthaler et al. | |
| 6,422,687 B1 | 7/2002 | Jacobson | |
| 6,445,374 B1 | 9/2002 | Albert et al. | |
| 6,445,489 B1 | 9/2002 | Jacobson et al. | |
| 6,459,418 B1 | 10/2002 | Comiskey et al. | |
| 6,473,072 B1 | 10/2002 | Comiskey et al. | |
| 6,480,182 B1 | 11/2002 | Turner et al. | |
| 6,498,114 B1 | 12/2002 | Amundson et al. | |
| 6,504,524 B1 | 1/2003 | Gates et al. | |
| 6,506,438 B1 | 1/2003 | Duthaler et al. | |
| 6,512,354 B1 | 1/2003 | Jacobson et al. | |
| 6,515,649 B1 | 2/2003 | Albert et al. | |
| 6,518,949 B1 | 2/2003 | Drzaic | |
| 6,521,489 B1 | 2/2003 | Duthaler et al. | |
| 6,531,997 B1 | 3/2003 | Gates et al. | |
| 6,535,197 B1 | 3/2003 | Comiskey et al. | |
| 6,538,801 B1 | 3/2003 | Jacobson et al. | |
| 6,545,291 B1 | 4/2003 | Amundson et al. | |
| 6,580,545 B1 | 6/2003 | Morrison et al. | |
| 6,639,578 B1 | 10/2003 | Comiskey et al. | |
| 6,639,643 B1 * | 10/2003 | Babuka et al. | 349/155 |
| 6,652,075 B1 | 11/2003 | Jacobson | |
| 6,657,772 B1 | 12/2003 | Loxley | |
| 6,664,944 B1 | 12/2003 | Albert et al. | |
| 6,665,044 B1 * | 12/2003 | Jacobsen et al. | 349/187 |
| D485,294 S | 1/2004 | Albert | |
| 6,672,921 B1 | 1/2004 | Liang et al. | |
| 6,680,725 B1 | 1/2004 | Jacobson | |
| 6,683,333 B1 | 1/2004 | Kazlas et al. | |
| 6,693,620 B1 | 2/2004 | Herb et al. | |
| 6,704,133 B1 | 3/2004 | Gates et al. | |
| 6,707,516 B1 * | 3/2004 | Johnson et al. | 349/78 |
| 6,710,540 B1 | 3/2004 | Albert et al. | |
| 6,721,083 B1 | 4/2004 | Jacobson et al. | |
| 6,724,519 B1 | 4/2004 | Comiskey et al. | |
| 6,727,881 B1 | 4/2004 | Albert et al. | |
| 6,738,050 B1 | 5/2004 | Comiskey et al. | |
| 6,750,473 B1 | 6/2004 | Amundson et al. | |
| 6,753,999 B1 | 6/2004 | Zehner et al. | |
| 6,788,449 B1 | 9/2004 | Liang et al. | |
| 6,816,147 B1 | 11/2004 | Albert | |
| 6,819,471 B1 | 11/2004 | Amundson et al. | |
| 6,822,782 B1 | 11/2004 | Honeyman et al. | |
| 6,825,068 B1 | 11/2004 | Denis et al. | |
| 6,825,829 B1 | 11/2004 | Albert et al. | |
| 6,825,909 B1 * | 11/2004 | Walker et al. | 349/158 |
| 6,825,970 B1 | 11/2004 | Goenaga et al. | |
| 6,831,769 B1 | 12/2004 | Holman et al. | |
| 6,839,158 B1 | 1/2005 | Albert et al. | |
| 6,842,167 B1 | 1/2005 | Albert et al. | |
| 6,842,279 B1 | 1/2005 | Amundson | |
| 6,842,657 B1 | 1/2005 | Drzaic et al. | |
| 6,844,673 B1 * | 1/2005 | Bernkopf | 313/506 |
| 6,859,247 B1 * | 2/2005 | Murade et al. | 349/139 |
| 6,864,875 B1 | 3/2005 | Drzaic et al. | |
| 6,865,010 B1 | 3/2005 | Duthaler et al. | |
| 6,866,760 B1 | 3/2005 | Paolini, Jr. et al. | |
| 6,870,657 B1 | 3/2005 | Fitzmaurice et al. | |
| 6,870,661 B1 | 3/2005 | Pullen et al. | |
| 6,900,851 B1 | 5/2005 | Morrison et al. | |
| 6,924,863 B1 * | 8/2005 | Nishida et al. | 349/141 |
| 6,950,220 B1 | 9/2005 | Abramson et al. | |
| 6,956,633 B1 * | 10/2005 | Okada et al. | 349/139 |
| 6,958,848 B1 | 10/2005 | Cao et al. | |
| 6,967,640 B1 | 11/2005 | Albert et al. | |
| 6,980,196 B1 | 12/2005 | Turner et al. | |
| 6,982,178 B1 | 1/2006 | LeCain et al. | |
| 2002/0000994 A1 * | 1/2002 | Bergstrom et al. | 345/605 |
| 2002/0060321 A1 | 5/2002 | Kazlas et al. | |
| 2002/0063661 A1 | 5/2002 | Comiskey et al. | |
| 2002/0090980 A1 | 7/2002 | Wilcox et al. | |
| 2002/0113770 A1 | 8/2002 | Jacobson et al. | |
| 2002/0130832 A1 | 9/2002 | Baucom et al. | |
| 2002/0180687 A1 | 12/2002 | Webber | |
| 2003/0011560 A1 | 1/2003 | Albert et al. | |
| 2003/0102858 A1 | 6/2003 | Jacobson et al. | |
| 2003/0132908 A1 | 7/2003 | Herb et al. | |
| 2003/0151702 A1 | 8/2003 | Morrison et al. | |
| 2004/0119681 A1 | 6/2004 | Albert et al. | |
| 2004/0155857 A1 | 8/2004 | Duthaler et al. | |
| 2004/0180476 A1 | 9/2004 | Kazlas et al. | |
| 2005/0035941 A1 | 2/2005 | Albert et al. | |

FOREIGN PATENT DOCUMENTS

| | | |
|---|---|---|
| EP | 0 981 065 | 2/2000 |
| EP | 1 145 072 B1 | 5/2003 |
| WO | WO 00/05704 | 2/2000 |
| WO | WO 00/36560 | 6/2000 |
| WO | WO 00/38000 | 6/2000 |
| WO | WO 00/67110 | 11/2000 |
| WO | WO 00/67327 | 11/2000 |

| | | |
|---|---|---|
| WO | WO 01/07961 | 2/2001 |

OTHER PUBLICATIONS

Au, J. et al., "Ultra-Thin 3.1-in. Active-Matrix Electronic Ink Display for Mobile Devices", IDW'02, 223 (2002).

Bach, U., et al., "Nanomaterials-Based Electrochromics for Paper-Quality Displays", Adv. Mater, 14(11), 845 (2002).

Caillot, E. et al. "Active Matrix Electrophoretic Information Display for High Performance Mobile Devices", IDMC Proceedings (2003).

Chen, Y., et al., "A Conformable Electronic Ink Display using a Foil-Based a-Si TFT Array", SID 01 Digest, 157 (Jun. 2001).

Comiskey, B., et al., "An electrophoretic ink for all-printed reflective electronic displays", Nature, 394, 253 (1998).

Comiskey, B., et al., "Electrophoretic Ink: A Printable Display Material", SID 97 Digest (1997), p. 75.

Danner, G.M. et al., "Reliability Performance for Microencapsulated Electrophoretic Displays with Simulated Active Matrix Drive", SID 03 Digest, 573 (2003).

Drzaic, P., et al., "A Printed and Rollable Bistable Electronic Display", SID 98 Digest (1998), p. 1131.

Duthaler, G., et al., "Active-Matrix Color Displays Using Electrophoretic Ink and Color Filters", SID 02 Digest, 1374 (2002).

Henzen, A. et al., "Development of Active Matrix Electronic Ink Displays for Handheld Devices", SID 03 Digest, 176, (2003).

Henzen, A. et al., "Development of Active Matrix Electronic Ink Displays for Smart Handheld Applications", IDW'02, 227 (2002).

Jacobson, J., et al., "The last book", IBM Systems J., 36, 457 (1997).

Jo, G-R, et al., "Toner Display Based on Particle Movements", Chem. Mater, 14, 664 (2002).

Kazlas, P. et al., "Card-size Active-matrix Electronic Ink Display", Eurodisplay 2002, 259 (2002).

Kazlas, P., et al., "12.1" SVGA Microencapsulated Electrophoretic Active Matrix Display for Information Applicances", SID 01 Digest, 152 (Jun. 2001).

Kitamura, T., et al., "Electrical toner movement for electronic paper-like display", Asia Display/IDW'01, p. 1517, Paper HCS1-1 (2001).

Ma, E.Y. et al., "Thin Film Transistors For Foldable Displays", IEDM 97, 535-538, (1997).

O'Regan, B. et al., "A Low Cost, High-efficiency Solar Cell Based on Dye-sensitized colloidal $TiO_2$ Films", Nature, vol. 353, Oct. 24, 1991, 773-740.

Pitt, M.G., et al., "Power Consumption of Microencapsulated Electrophoretic Displays for Smart Handheld Applications", SID 02 Digest, 1378 (2002).

Rogers, J.A. et al., "Paper-like electronic displays: Large-area rubber-stamped plastic sheets of electronics and microencapsulated electrophoretic inks" PNAS, Apr. 24, 2001, vol. 98, No. 9, 4835-4840 (2001).

Suo, Z., et al., "Mechanics of rollable and foldable film-on-foil electronics", App. Phys. Lett., 74, 1177 (1999).

Webber, R., "Image Stability in Active-Matrix Microencapsulated Electrophoretic Displays", SID 02 Digest, 126 (2002).

Wood, D., "An Electrochromic Renaissance?" Information Display, 18(3), 24 (Mar. 2002).

Yamaguchi, Y., et al., "Toner display using insulative particles charged triboelectrically", Asia Display/IDW '01, p. 1729, Paper AMD4-4 (2001).

Zehner, R. et al., "Drive Waveforms for Active Matrix Electrophoretic Displays", SID 03 Digest, 842 (2003).

* cited by examiner

BACKPLANES FOR DISPLAY APPLICATIONS, AND COMPONENTS FOR USE THEREIN

CROSS REFERENCE TO RELATED APPLICATIONS

This application claims priority from Application Ser. Nos. 60/375,508 and 60/375,571, both filed Apr. 24, 2002.

REFERENCED-APPLICATIONS

This application is also related to copending application Ser. No. 09/565,413, filed May 5, 2000 (now U.S. Pat. No. 7,030,412); copending application Ser. No. 09/904,109, filed Jul. 12, 2001 (Publication No. 2002/0106847, now U.S. Pat. No. 6,683,333); copending application Ser. No. 09/904,435, filed Jul. 12, 2001 (Publication No. 2002/0060321), and copending application Ser. No. 10/065,795, filed Nov. 20, 2002 (Publication No. 2003/0137521, now U.S. Pat. No. 7,012,600). This application is also related to copending application Ser. No. 10/249,624, filed Apr. 24, 2003 (Publication No. 2004/0014265). The entire contents of the aforementioned applications are herein incorporated by reference. The entire contents of all United States Patents and published Applications mentioned below are also herein incorporated by reference.

BACKGROUND OF INVENTION

The present invention relates to backplanes for electro-optic (electronic) displays. This invention also relates to certain improvements in non-linear devices for use in such backplanes, and to processes for forming such non-linear devices. Finally, this invention also relates to drivers for use with such backplanes.

The term "electro-optic", as applied to a material or a display, is used herein in its conventional meaning in the imaging art to refer to a material having first and second display states differing in at least one optical property, the material being changed from its first to its second display state by application of an electric field to the material. Although the optical property is typically color perceptible to the human eye, it may be another optical property, such as optical transmission, reflectance, luminescence or, in the case of displays intended for machine reading, pseudo-color in the sense of a change in reflectance of electromagnetic wavelengths outside the visible range.

The term "gray state" is used herein in its conventional meaning in the imaging art to refer to a state intermediate two extreme optical states of a pixel, and does not necessarily imply a black-white transition between these two extreme states. For example, several of the patents and published applications referred to below describe electrophoretic displays in which the extreme states are white and deep blue, so that an intermediate "gray state" would actually be pale blue. Indeed, as already mentioned the transition between the two extreme states may not be a color change at all.

The terms "bistable" and "bistability" are used herein in their conventional meaning in the art to refer to displays comprising display elements having first and second display states differing in at least one optical property, and such that after any given element has been driven, by means of an addressing pulse of finite duration, to assume either its first or second display state, after the addressing pulse has terminated, that state will persist for at least several times, for example at least four times, the minimum duration of the addressing pulse required to change the state of the display element. It is shown in published U.S. patent application Ser. No. 2002/0180687 that some particle-based electrophoretic displays capable of gray scale are stable not only in their extreme black and white states but also in their intermediate gray states, and the same is true of some other types of electro-optic displays. This type of display is properly called "multi-stable" rather than bistable, although for convenience the term "bistable" may be used herein to cover both bistable and multi-stable displays.

Several types of electro-optic displays are known. One type of electro-optic display is a rotating bichromal member type as described, for example, in U.S. Pat. Nos. 5,808,783; 5,777,782; 5,760,761; 6,054,071 6,055,091; 6,097,531; 6,128,124; 6,137,467; and 6,147,791 (although this type of display is often referred to as a "rotating bichromal ball" display, the term "rotating bichromal member" is preferred as more accurate since in some of the patents mentioned above the rotating members are not spherical). Such a display uses a large number of small bodies (typically spherical or cylindrical) which have two or more sections with differing optical characteristics, and an internal dipole. These bodies are suspended within liquid-filled vacuoles within a matrix, the vacuoles being filled with liquid so that the bodies are free to rotate. The appearance of the display is changed to applying an electric field thereto, thus rotating the bodies to various positions and varying which of the sections of the bodies is seen through a viewing surface. This type of electro-optic medium is typically bistable.

Another type of electro-optic display uses an electrochromic medium, for example an electrochromic medium in the form of a nanochromic film comprising an electrode formed at least in part from a semi-conducting metal oxide and a plurality of dye molecules capable of reversible color change attached to the electrode; see, for example O'Regan, B., et al., Nature 1991, 353, 737; and Wood, D., Information Display, 18(3), 24 (March 2002). See also Bach, U., et al., Adv. Mater., 2002, 14(11), 845. Nanochromic films of this type are also described, for example, in U.S. Pat. No. 6,301,038, International Application Publication No. WO 01/27690, and in copending application Ser. No. 10/249, 128, filed Mar. 18, 2003, now U.S. Pat. No. 6,950,220. This type of medium is also typically bistable.

Another type of electro-optic display, which has been the subject of intense research and development for a number of years, is the particle-based electrophoretic display, in which a plurality of charged particles move through a suspending fluid under the influence of an electric field. Electrophoretic displays can have attributes of good brightness and contrast, wide viewing angles, state bistability, and low power consumption when compared with liquid crystal displays. Nevertheless, problems with the long-term image quality of these displays have prevented their widespread usage. For example, particles that make up electrophoretic displays tend to settle, resulting in inadequate service-life for these displays.

Numerous patents and applications assigned to or in the names of the Massachusetts Institute of Technology (MIT) and E Ink Corporation have recently been published describing encapsulated electrophoretic media. Such encapsulated media comprise numerous small capsules, each of which itself comprises an internal phase containing electrophoretically-mobile particles suspended in a liquid suspension medium, and a capsule wall surrounding the internal phase. Typically, the capsules are themselves held within a polymeric binder to form a coherent layer positioned between two electrodes. Encapsulated media of this type are described, for example, in U.S. Pat. Nos. 5,930,026; 5,961,804; 6,017,584; 6,067,185; 6,118,426; 6,120,588; 6,120,839; 6,124,851; 6,130,773; 6,130,774; 6,172,798; 6,177,921; 6,232,950; 6,249,271; 6,252,564; 6,262,706; 6,262,833; 6,300,932; 6,312,304; 6,312,971; 6,323,989; 6,327,072; 6,376,828; 6,377,387; 6,392,785; 6,392,786; 6,413,790; 6,422,687; 6,445,374; 6,445,489; 6,459,418; 6,473,072; 6,480,182; 6,498,114; 6,504,524; 6,506,438; 6,512,354; 6,515,649; 6,518,949; 6,521,489; 6,531,997; 6,535,197; 6,538,801; and 6,545,291; and U.S. Patent Applications Publication Nos. 2002/0019081; 2002/0021270; 2002/0053900; 2002/0060321; 2002/0063661; 2002/0063677; 2002/0090980; 2002/0106847; 2002/0113770; 2002/0130832; 2002/0131147; 2002/0145792; 2002/0154382; 2002/0171910; 2002/0180687; 2002/0180688; 2002/0185378; 2003/0011560; 2003/0011867; 2003/0011868; 2003/0020844; 2003/0025855; 2003/0034949; 2003/0038755; and 2003/0053189; and International Applications Publication Nos. WO 99/67678; WO 00/05704; WO 00/20922; WO 00/26761; WO 00/38000; WO 00/38001; WO 00/36560; WO 00/67110; WO 00/67327; WO 01/07961; and WO 01/08241.

Many of the aforementioned patents and applications recognize that the walls surrounding the discrete microcapsules in an encapsulated electrophoretic medium could be replaced by a continuous phase, thus producing a so-called polymer-dispersed electrophoretic display in which the electrophoretic medium comprises a plurality of discrete droplets of an electrophoretic fluid and a continuous phase of a polymeric material, and that the discrete droplets of electrophoretic fluid within such a polymer-dispersed electrophoretic display may be regarded as capsules or microcapsules even though no discrete capsule membrane is associated with each individual droplet; see for example, the aforementioned 2002/0131147. Accordingly, for purposes of the present application, such polymer-dispersed electrophoretic media are regarded as sub-species of encapsulated electrophoretic media.

An encapsulated electrophoretic display typically does not suffer from the clustering and settling failure mode of traditional electrophoretic devices and provides further advantages, such as the ability to print or coat the display on a wide variety of flexible and rigid substrates. (Use of the word "printing" is intended to include all forms of printing and coating, including, but without limitation: pre-metered coatings such as patch die coating, slot or extrusion coating, slide or cascade coating, curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; inkjet printing processes; and other similar techniques.) Thus, the resulting display can be flexible. Further, because the display medium can be printed (using a variety of methods), the display itself can be made inexpensively.

A related type of electrophoretic display is a so-called "microcell electrophoretic display". In a microcell electrophoretic display, the charged particles and the suspending fluid are not encapsulated within microcapsules but instead are retained within a plurality of cavities formed within a carrier medium, typically a polymeric film. See, for example, International Application Publication No. WO 02/01281, and published U.S. application Ser. No. 2002/0075556, both assigned to Sipix Imaging, Inc.

The aforementioned types of electro-optic displays are bistable and are typically used in a reflective mode, although as described in certain of the aforementioned patents and applications, such displays may be operated in a "shutter mode" in which the electro-optic medium is used to modulate the transmission of light, so that the display operates in a transmissive mode. Liquid crystals, including polymer-dispersed liquid crystals, are, of course, also electro-optic media, but are typically not bistable and operate in a transmissive mode. Certain embodiments of the invention described below are confined to use with reflective displays, while others may be used with both reflective and transmissive displays, including conventional liquid crystal displays.

Whether a display is reflective or transmissive, and whether or not the electro-optic medium used is bistable, to obtain a high-resolution display, individual pixels of a display must be addressable without interference from adjacent pixels. One way to achieve this objective is to provide an array of non-linear elements, such as transistors or diodes, with at least one non-linear element associated with each pixel, to produce an "active matrix" display. An addressing or pixel electrode, which addresses one pixel, is connected to an appropriate voltage source through the associated non-linear element. Typically, when the non-linear element is a transistor, the pixel electrode is connected to the drain of the transistor, and this arrangement will be assumed in the following description, although it is essentially arbitrary and the pixel electrode could be connected to the source of the transistor. Conventionally, in high resolution arrays, the pixels are arranged in a two-dimensional array of rows and columns, such that any specific pixel is uniquely defined by the intersection of one specified row and one specified column. The sources of all the transistors in each column are connected to a single column electrode, while the gates of all the transistors in each row are connected to a single row electrode; again the assignment of sources to rows and gates to columns is conventional but essentially arbitrary, and could be reversed if desired. The row electrodes are connected to a row driver, which essentially ensures that at any given moment only one row is selected, i.e., that there is applied to the selected row electrode a voltage such as to ensure that all the transistors in the selected row are conductive, while there is applied to all other rows a voltage such as to ensure that all the transistors in these non-selected rows remain non-conductive. The column electrodes are connected to column drivers, which place upon the various column electrodes voltages selected to drive the pixels in the selected row to their desired optical states. (The aforementioned voltages are relative to a common front electrode which is conventionally provided on the opposed side of the electro-optic medium from the non-linear array and extends across the whole display.) After a pre-selected interval known as the "line address time" the selected row is deselected, the next row is selected, and the voltages on the column drivers are changed to that the next line of the display is written. This process is repeated so that the entire display is written in a row-by-row manner.

Processes for manufacturing active matrix displays are well established. Thin-film transistors, for example, can be fabricated using various deposition and photolithography techniques. A transistor includes a gate electrode, an insulating dielectric layer, a semiconductor layer and source and drain electrodes. Application of a voltage to the gate electrode provides an electric field across the dielectric layer, which dramatically increases the source-to-drain conductivity of the semiconductor layer. This change permits electrical conduction between the source and the drain electrodes. Typically, the gate electrode, the source electrode, and the drain electrode are patterned. In general, the semiconductor layer is also patterned in order to minimize stray conduction (i.e., cross-talk) between neighboring circuit elements.

Liquid crystal displays commonly employ amorphous silicon ("a-Si"), thin-film transistors ("TFT's") as switching devices for display pixels. Such TFT's typically have a bottom-gate configuration. Within one pixel, a thin film capacitor typically holds a charge transferred by the switching TFT. Electrophoretic displays can use similar TFT's with capacitors, although the function of the capacitors differs somewhat from those in liquid crystal displays; see the aforementioned copending application Ser. No. 09/565, 413, and Publications 2002/0106847 and 2002/0060321. Thin film transistors can be fabricated to provide high performance. Fabrication processes, however, can result in significant cost.

In TFT addressing arrays, pixel electrodes are charged via the TFT's during a line address time. During the line address time, a TFT is switched to a conducting state by changing an applied gate voltage. For example, for an n-type TFT, a gate voltage is switched to a "high" state to switch the TFT into a conducting state.

Undesirably, the pixel electrode typically exhibits a voltage shift when the select line voltage is changed to bring the TFT channel into depletion. The pixel electrode voltage shift occurs because of the capacitance between the pixel electrode and the TFT gate electrode. The voltage shift can be modeled as:

$$\Delta V_p = \frac{C_{gp}}{C_{gp} + C_p + C_s} \Delta$$

where $C_{gp}$ is the gate-pixel capacitance, $C_p$ the pixel capacitance, $C_s$ the storage capacitance and $\Delta$ is the fraction of the gate voltage shift when the TFT is effectively in depletion. This voltage shift is often referred to as "gate feedthrough".

Gate feedthrough can compensated by shifting the top plane voltage (the voltage applied to the common front electrode) by an amount $\Delta V_p$. Complications arise, however, because $\Delta V_p$ varies from pixel to pixel due to variations of $C_{gp}$ from pixel to pixel. Thus, voltage biases can persist even when the top plane is shifted to compensate for the average pixel voltage shift. The voltage biases can cause errors in the optical states of pixels, as well as degrade the electro-optic medium.

Variations in $C_{gp}$ are caused, for example, by misalignment between the two conductive layers used to form the gate and the source-drain levels of the TFT; variations in the gate dielectric thickness; and variations in the line etch, i.e., line width errors.

Some tolerance for mis-registered conductive layers can be obtained by utilizing a gate electrode that completely overlaps the drain electrode. This technique, however, can cause a large gate-pixel capacitance. A large gate-pixel capacitance is undesirable because it can create a need for a large compensation in one of the select line voltage levels. Moreover, existing addressing structures can produce unintended bias voltages, for example, due to pixel-to-pixel variations in gate-pixel capacitance. Such voltages can produce a detrimental effect on certain electro-optic media, particularly when present for extended periods of time.

In one aspect, this invention seeks to provide a registration-tolerant transistor design which does not introduce an excessive gate-pixel capacitance.

In many electronic device applications, simplified lower cost manufacturing methods are highly desirable, and in a second aspect this invention seeks to provide a simplified, low cost method for the manufacture of diode matrix arrays.

A further aspect of the present invention relates to backplane designs with reduced source line coupling. As already mentioned, an active matrix display has row electrodes (also known as "select lines") and column electrodes (also known as "source lines") which traverse the active area of the display (i.e., the area on which an image is formed). In most transmissive TFT-based backplanes, the source and select lines traverse the active area in the regions between columns and rows of pixel electrodes. The electric field lines emitted by these source and select lines run through the electro-optic medium layer. These field lines cause undesired optical shifts that are typically hidden from an observer by a light blocking patterned mask on the viewing surface of the display.

However, typically in a reflective display, the pixel electrodes fill the active area except for thin gaps between the pixels. The source and select lines run under the pixel electrodes, and are separated from the pixel electrodes by one or more dielectric layers. This may be referred to as a "field-shielded pixel" backplane design. In such a design, very few of the electric field lines from the source or select lines reach the electro-optic medium layer; instead, most of these field lines end on the pixel electrodes. Thus, the electro-optic medium layer, is almost completely shielded from the field lines emanating from the source and select lines, due to the intervening pixel electrodes, thus avoiding the undesired optical shifts which these field lines might otherwise produce. This is a preferred arrangement, particularly since it enables one to avoid incorporating a light blocking patterned mask on the front of the display; elimination of the mask increases the proportion of the display surface which can change optical state as the electro-optic medium changes, thus increasing the contrast between the extreme optical states of the display.

The field shielded design does, however, result in the source and select lines have a relatively large capacitative coupling to the pixel electrodes. Consequently, the pixel electrodes experience significant voltage shifts whenever an underlying source or select line shifts in voltage, and these voltage shifts can induce unwanted optical transitions in the electro-optic medium layer.

The capacitative voltage shifts can be reduced by including larger storage capacitors in the backplane, or by reducing source and select line widths. However, both approaches have disadvantages; larger storage capacitors require larger transistors and increase the power consumption of the display and parasitic voltages therein, and thinner source and select lines produce larger resistive voltage drops and increase the chance of line breaks.

Voltage shifts due to capacitance between the pixels and a select line are predictable and therefore can be compensated. Alternatively, the effect of the voltage shift can be reduced in either of two ways. Firstly, the top plane voltage of the display can be shifted to compensate for a voltage shift in the pixel. Secondly, the select lines can be arranged so that they select one row but have a large capacitance only with the next row to be selected. This is achieved in the field-shielded backplane design, for example, by placing each select line under the row of pixels adjacent to the row that the specific select line selects.

There is no analogous strategy for dealing with source line capacitances, since source line voltages are dependent on the voltages required to address each pixel in the selected row, and thus vary with the desired image. Thus, there is no universal way to compensate for pixel voltage shifts caused by capacitative coupling to source lines in standard backplane designs.

In a third aspect, the present invention relates to a backplane design having reduced capacitative coupling between the source lines and the overlying pixel electrodes. The present invention provides two separate approaches to achieving such reduced capacitative coupling. In the first approach, a storage capacitor electrode is extended to cover at least part of the source line. In the second approach, a balance line in provided adjacent each source line, such that the capacitative coupling between the balance line and the pixel electrode at least partially compensates for the capacitative coupling between the source line and the pixel electrode.

Finally, the present invention provides a driver for driving the source and balance lines in a display provided with such balance lines.

SUMMARY OF INVENTION

The invention features, in part, electronic circuits that have a lower manufacturing cost, and methods of making electronic circuits that involve simpler processing steps.

As already mentioned, one aspect of this invention relates to registration-tolerant transistor (especially TFT) designs. The transistors are particularly useful for addressing display media in a display device, and in some embodiments can provide relatively low pixel-to-pixel variations in gate-pixel capacitance.

Accordingly, in one aspect this invention provides a transistor comprising a source electrode, a drain electrode spaced from the source electrode by a channel, a semiconductor layer extending across the channel, and a gate electrode disposed adjacent the channel such that application of a voltage to the gate electrode will vary the conductivity of the semiconductor layer extending across the channel. The gate electrode has a first gate electrode edge and a second gate electrode edge spaced from the first gate electrode edge. The drain electrode has a first drain electrode edge portion which overlaps the first gate electrode edge to define a first overlap area, and also has a second drain electrode edge portion which overlaps the second gate electrode edge to define a second overlap area, such that translation of the gate electrode relative to the drain electrode in a direction which increases the first overlap area will decrease the second overlap area, or vice versa.

This transistor of the present invention may be a thin film transistor wherein the source electrode, the drain electrode, the gate electrode and the semiconductor layer have the form of thin layers deposited upon a substrate. The minimum length of overlap (i.e., the minimum width of the first and second overlap areas) should typically be chosen so as to be at least equal the predetermined registration error for any specific process for forming the transistor.

In one form of the transistor of the present invention, the gate electrode comprises a base portion and first and second projections extending in one direction away from the base portion and substantially parallel to each other, and the first and second gate electrode edges are formed by the edges of the first and second projections respectively facing away from the other of said projections. In this form of the transistor, the source electrode may extend between the first and second projections and overlap the inward edges of each of these projections. Obviously, as previously indicated, in such a transistor the positions of the source and drain electrodes may be interchanged.

In another form of the transistor of the present invention, the gate electrode has the form of a polygon having a central aperture, a central portion of the drain electrode overlaps at least part of this central aperture, and the first and second overlap areas are formed by overlap between the drain electrode and portions of the gate electrode adjacent this central aperture. The central aperture may have two straight edges on opposed sides of the aperture, these straight edges forming the first and second gate electrode edges.

The transistor of the present invention may comprise a capacitor electrode overlapping part of the drain electrode, and a dielectric layer disposed between the capacitor electrode and the drain electrode so that the capacitor electrode and the drain electrode together form a capacitor. In such a capacitor-containing transistor, the gate electrode may have substantially the form of a polygon having a central aperture, with a central portion of the drain electrode overlapping at least part of this central aperture, so that the first and second overlap areas are formed by overlap between the drain electrode and portions of the gate electrode adjacent the central aperture, with the capacitor electrode disposed within the central aperture and connected to a capacitor electrode line by a conductor passing through a gap in the gate electrode.

The transistor of the present invention may comprise a pixel electrode connected to the drain electrode. The transistor may be of the so-called "buried" type, in which a layer of dielectric is disposed between the drain electrode and the pixel electrode, and a conductive via extends from the drain electrode to the pixel electrode through the layer of dielectric. In such a buried transistor, the pixel electrode may overlie both the gate and drain electrodes.

This aspect of the present invention extends to a backplane for an electro-optic display, this backplane comprising a substrate and at least one transistor of the invention. This aspect of the present invention also extends to an electro-optic display comprising such a backplane, a layer of electro-optic medium disposed on the backplane and covering the at least one transistor, and a front electrode disposed on the opposed side of the layer of electro-optic medium from the substrate and the at least one transistor. Such an electro-optic display may use any of the types of electro-optic medium previously discussed; for example, the electro-optic medium may be a liquid crystal, a rotating bichromal member or electrochromic medium, or an electrophoretic medium, preferably an encapsulated electrophoretic medium. The electro-optic display may include a light blocking layer.

In another aspect, this invention provides a process for forming a plurality of diodes on a substrate. This process comprises:

depositing a conductive layer on the substrate;

depositing a first doped semiconductor layer on the substrate over the conductive layer;

patterning the conductive layer and the doped semiconductor layer to form a plurality of discrete conductive layer/first doped semiconductor layer areas;

depositing an undoped semiconductor layer on the substrate over the plurality of discrete conductive layer/first doped semiconductor layer areas; and forming a plurality of second doped semiconductor layer areas on the opposed side of the undoped semiconductor layer from the plurality of discrete conductive layer/first doped semiconductor layer areas, whereby in the plurality of discrete conductive layer/first doped semiconductor layer areas, the undoped semiconductor layer and the plurality of second doped semiconductor layer areas form a plurality of diodes on the substrate.

In this process, the patterning step may be effected by lithography. The undoped semiconductor layer need not necessarily be patterned; instead, this undoped layer may extend continuously between adjacent diodes. The first doped semiconductor layer may be formed of n-doped amorphous silicon, the undoped semiconductor layer may be formed of amorphous silicon, and the plurality of second doped semiconductor layer areas may be formed of n-doped amorphous silicon.

In one version of this process of the present invention, the plurality of second doped semiconductor layer areas are formed by first depositing a continuous second doped semiconductor layer and thereafter patterning this layer to form the plurality of second doped semiconductor layer areas. After deposition of the continuous second doped semiconductor layer, a continuous second conductive layer may be deposited over the second doped semiconductor layer and both the second doped semiconductor layer and the second conductive layer patterned in a single patterning step. Alternatively, after deposition of the continuous second doped semiconductor layer, a patterned second conductive layer may be deposited over the second doped semiconductor layer and the patterned second conductive layer thereafter used as an etch mask for patterning of the second doped semiconductor layer.

In another version of this process of the present invention, the plurality of second doped semiconductor layer areas are formed by printing.

This invention also provides another process for forming a diode on a substrate. This process comprises:

depositing a doped semiconductor layer on the substrate;

forming two spaced areas of undoped semiconductor material on the opposed side of the doped semiconductor layer from the substrate; and forming two spaced areas of conductive material, each of said areas being in contact with one of the areas of undoped semiconductor material on the opposed side thereof from the doped semiconductor layer.

The two spaced areas of conductive material in the diode formed by this process form two contacts for a back-to-back diode.

In one form of this process, the two spaced areas of undoped semiconductor material and the two spaced areas of conductive material are formed by depositing continuous layers of undoped semiconductor material and conductive material and thereafter patterning both these continuous layers to form the spaced areas. The patterning of the continuous layers of undoped semiconductor material and conductive material may be effected in a single lithographic patterning step.

Alternatively, the two spaced areas of undoped semiconductor material and the two spaced areas of conductive material may be formed by depositing a continuous layer of undoped semiconductor material, forming the two spaced areas of conductive material, and thereafter using the two spaced areas of conductive material as an etch mask for patterning of the continuous layer of undoped semiconductor material to form the two spaced areas of undoped semiconductor material.

In this second process of the present invention, the doped semiconductor layer may be formed of n-doped amorphous silicon, and the undoped semiconductor material of amorphous silicon.

Preferred embodiments of the two processes of the present invention can produce displays addressed by n/i/n (i.e., n-type/intrinsic/n-type) or i/n/i a-Si diode arrays and with a resolution that is comparable to displays addressed by TFT arrays. The diode array can be manufactured via low-cost methods having fewer, simpler processing steps than conventional processes for forming such diode arrays.

In another aspect, this invention provides a backplane for an electro-optic display. This backplane comprises a source line, a transistor and a pixel electrode connected to the source line via the transistor. The pixel electrode extends over part of the source line to form an overlap area. The backplane also comprises a conductive portion disposed between the source line and the pixel electrode, this conductive portion reducing the source line/pixel electrode capacitance.

This aspect of the present invention may hereinafter be called the "screened source line backplane".

In such a backplane, the conductive portion will typically extend over at least about 30 percent of the overlap area. Desirably, the conductive portion will extend over at least about 80 percent, and preferably at least about 90 percent, of the overlap area.

The screened source line backplane may comprise a capacitor electrode which forms a capacitor with at least one of the pixel electrode and the electrode of the transistor connected directly to the pixel electrode, with the conductive portion being connected to the capacitor electrode.

The screened source line backplane may use a transistor of the aforementioned buried type; thus in this backplane, the drain electrode of the transistor may be connected to the pixel electrode, and the backplane further comprise a layer of dielectric disposed between the drain electrode and the pixel electrode, and a conductive via extending from the drain electrode to the pixel electrode through the layer of dielectric, with the capacitor electrode forming the capacitor with the drain electrode.

This invention extends to an electro-optic display comprising a screened source line backplane of the invention, a layer of electro-optic medium disposed on the backplane and covering the pixel electrode, and a front electrode disposed on the opposed side of the layer of electro-optic medium from the pixel electrode. Such an electro-optic display may use any of the types of electro-optic medium previously discussed; for example, the electro-optic medium may be a liquid crystal, a rotating bichromal member or electrochromic medium, or an electrophoretic medium, preferably an encapsulated electrophoretic medium. The electro-optic display may include a light blocking layer.

In another aspect, this invention provides a backplane for an electro-optic display, the backplane comprising a source line, a transistor and a pixel electrode connected to the source line via the transistor, the pixel electrode lying adjacent part of the source line so as to provide a source line/pixel electrode capacitance. The backplane further comprises a balance line at least part of which is disposed adjacent the pixel electrode so as to provide a balance line/pixel electrode capacitance, and voltage supply means for applying to the balance line a voltage opposite in polarity to that applied to the source line.

This aspect of the present invention may hereinafter be called the "balance line backplane".

In a balance line backplane, the balance line may extend substantially parallel to the source line. The balance line may have substantially the same shape as the source line, or a shape which is substantially a mirror image of the shape of the source line. Alternatively, the balance line may be wider than the source line, for reasons explained below.

The purpose of introducing the balance line into the balance line backplane of the present invention is to make use of the capacitative coupling between this balance line and the pixel electrode so as to counteract the effects of the capacitative coupling between the source line and the pixel electrode. In each case, the effect of the capacitative coupling on the electro-optic medium is essentially proportional to the product of the capacitance between the two integers and the voltage applied to source line or balance line. Thus, in order that the balance line will achieve a substantial reduction in the effects which would otherwise be caused by the capacitative coupling between the source line and the pixel electrode, typically the absolute value of the product of the balance line/pixel electrode capacitance and the voltage applied to the balance line by the voltage supply means should be at least about 50 percent of the absolute value of the product of the source line/pixel electrode capacitance and the voltage applied to the source line. Desirably, the absolute value of the product of the balance line/pixel electrode capacitance and the voltage applied to the balance line by the voltage supply means should be at least about 90 percent of the absolute value of the product of the source line/pixel electrode capacitance and the voltage applied to the source line, and ideally the two absolute values should be substantially equal. In a preferred embodiment of the balance line backplane, the balance line/pixel electrode capacitance is N times the source line/pixel electrode capacitance, where N is greater than 1, and the voltage supply means applies to the balance line a voltage of substantially—1/N times the voltage applied to the source line. Making N greater than 1 is conveniently achieved by using a balance line wider than the source line, as already described.

The balance backplane may be used with both transmissive and reflective displays. In a reflective display, typically the pixel electrode will overlie both the source line and the balance line. In this case, the transistor may be of the aforementioned buried type, with the drain electrode of the transistor connected to the pixel electrode, and the backplane further comprising a layer of dielectric disposed between the drain electrode and the pixel electrode, and a conductive via extending from the drain electrode to the pixel electrode through the layer of dielectric. On the other hand, in a reflective display typically the source line and the balance line will be coplanar with the pixel electrode.

This invention extends to an electro-optic display comprising a balance line backplane of the invention, a layer of electro-optic medium disposed on the backplane and covering the pixel electrode, and a front electrode disposed on the opposed side of the layer of electro-optic medium from the pixel electrode. Such an electro-optic display may use any of the types of electro-optic medium previously discussed; for example, the electro-optic medium may be a liquid crystal, a rotating bichromal member or electrochromic medium, or an electrophoretic medium, preferably an encapsulated electrophoretic medium. The electro-optic display may include a light blocking layer.

This invention also provides drivers for driving a balance line backplane. Thus, in another aspect this invention provides a driver for driving an electro-optic display having a source line and a balance line. This driver comprises:

a first input arranged to receive a digital signal representative of the magnitude of the voltage to be applied to the source line;

a second input arranged to receive a sign bit representative of the polarity of the voltage to be applied to the source line;

at least one digital/analogue converter;

a first output arranged to output a source line voltage the magnitude and polarity of which are determined by the signals received at the first and second inputs respectively; and a second output arranged to output a balance line voltage of opposite polarity to the source line voltage, the magnitude of the balance line voltage bearing a predetermined relationship to the magnitude of the source line voltage.

One embodiment of this driver has separate first and second digital/analogue converters, both the first and second digital/analogue converters being connected to both the first and second inputs. In one form of this embodiment, the first digital/analogue converter is connected to the first output and the second digital/analogue converter is connected to the second output. In another form of this embodiment, the first digital/analogue converter is a positive output digital/analogue converter and the second digital/analogue converter is a negative output digital/analogue converter, the driver further comprising a reversing switch having a first position in which the first digital/analogue converter is connected to the first output and the second digital/analogue converter is connected to the second output, and a second position in which the first digital/analogue converter is connected to the second output and the second digital/analogue converter is connected to the first output. The driver may further comprise a first digital processor connected between the first input and the input of the first digital/analogue converter and a second digital processor connected between the first input and the input of the second digital/analogue converter.

Finally, this invention provides a second form of driver for driving a balance line backplane of the invention. Thus, this invention provides a driver for driving an electro-optic display having a source line and a balance line, this driver comprising:

a first input arranged to receive a digital signal representative of the magnitude of the voltage to be applied to the source line;

a second input arranged to receive a sign bit representative of the polarity of the voltage to be applied to the source line;

a third input arranged to receive a digital signal representative of the magnitude of the voltage to be applied to the balance line;

a first positive output digital/analogue converter;

a second negative output digital/analogue converter;

a first output arranged to output a source line voltage the magnitude and polarity of which are determined by the signals received at the first and second inputs respectively;

a second output arranged to output a balance line voltage of opposite polarity to the source line voltage, the magnitude of the balance line voltage being determined by the signal received at the third input;

a first reversing switch connected to the first and third inputs and the inputs of the first and second digital/analogue converters, the first reversing switch having a first position in which the first input is connected to the first digital/analogue converter and the third input is connected to the second digital/analogue converter, and a second position in which the first input is connected to the second digital/ analogue converter and the third input is connected to the first digital/analogue converter; and a second reversing switch connected to the outputs of the first and second digital/analogue converters and the first and second outputs, the second reversing switch having a first position in which the first digital/analogue converter is connected to the first output and the second digital/analogue converter is connected to the second output, and a second position in which the first digital/analogue converter is connected to the second output and the second digital/analogue converter is connected to the first output.

BRIEF DESCRIPTION OF DRAWINGS

Preferred embodiments of the present invention will now be described, though by way of illustration only, with reference to the accompanying drawings, in which.

DETAILED DESCRIPTION

In the following detailed description, registration tolerant transistors will first be described with reference to FIGS. 1A–5. Next, processes for the formation of diodes and diode arrays by the processes of the present invention will be described with reference to FIG. 6A–8B. Screened source backplanes will then be described with reference to FIGS. 9A–10, and balance line backplanes will be described with reference to FIGS. 11–15. Finally, drivers of the present invention for driving balance line backplanes will be described with reference to FIGS. 16–20.

Registration-Tolerant Transistors

As already mentioned this invention provides a registration-tolerant transistor in which the gate electrode has two spaced edges and the drain electrode has first and second electrode edge portions which overlap the two spaced edges of the gate electrode to define two separate overlap areas, such that translation of the gate electrode relative to drain electrode (for example, due to registration errors during production of a TFT array) in a direction which increases one overlap area will decrease the other overlap area. Thus, the registration-tolerant transistor of the present invention can provide gate-pixel capacitances that are independent of, or only slightly sensitive to, small registration errors between the gate and source-drain conductive layers of a TFT. In contrast to prior art registration tolerant designs, this registration tolerance can be achieved without full overlap of gate and drain electrodes. In preferred embodiments, only a portion of the edges of the electrodes overlap. A relatively small gate-pixel capacitance can thus be achieved.

Figure 1A:
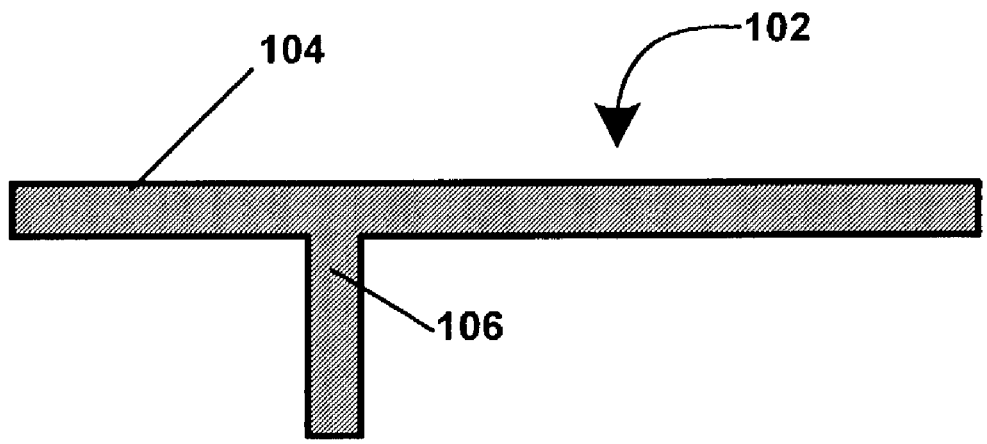
FIG. 1A is a top plan view of a first patterned metal layer forming the gate electrode and associated select line of a conventional thin film transistor (TFT)
Figure 1B:
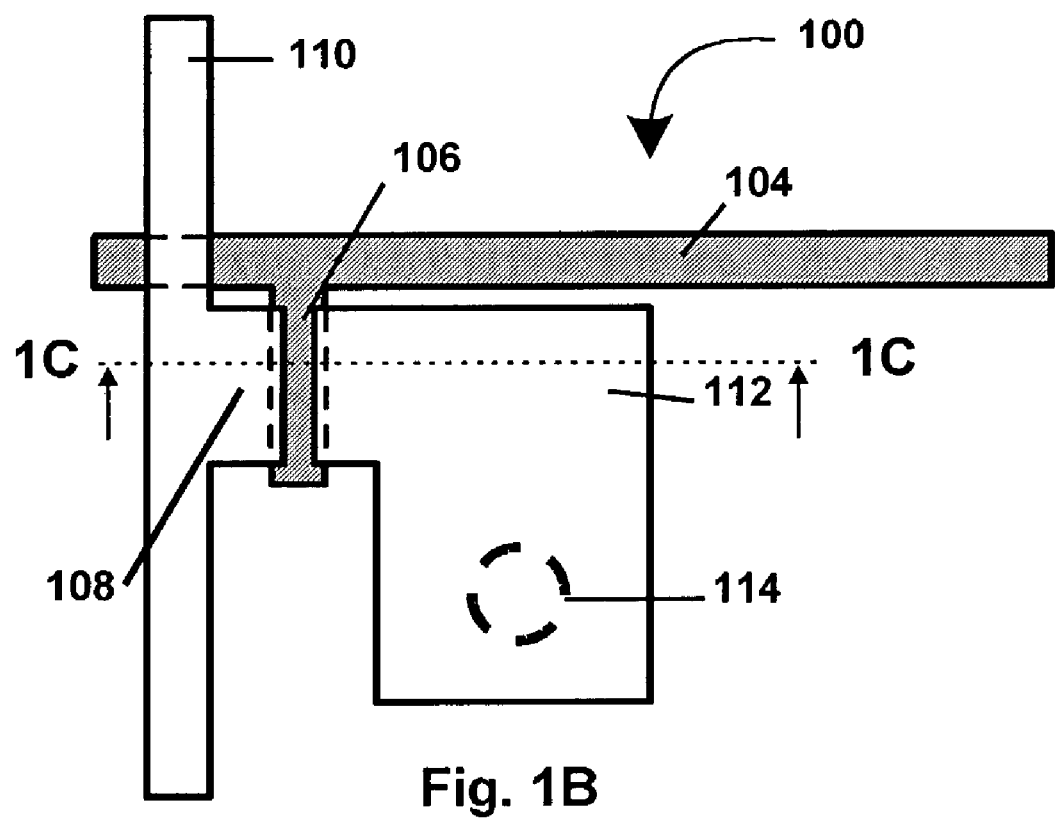
FIG. 1B is a top plan view of the conventional TFT incorporating the metal layer shown in FIG. 1A.
Figure 1C:
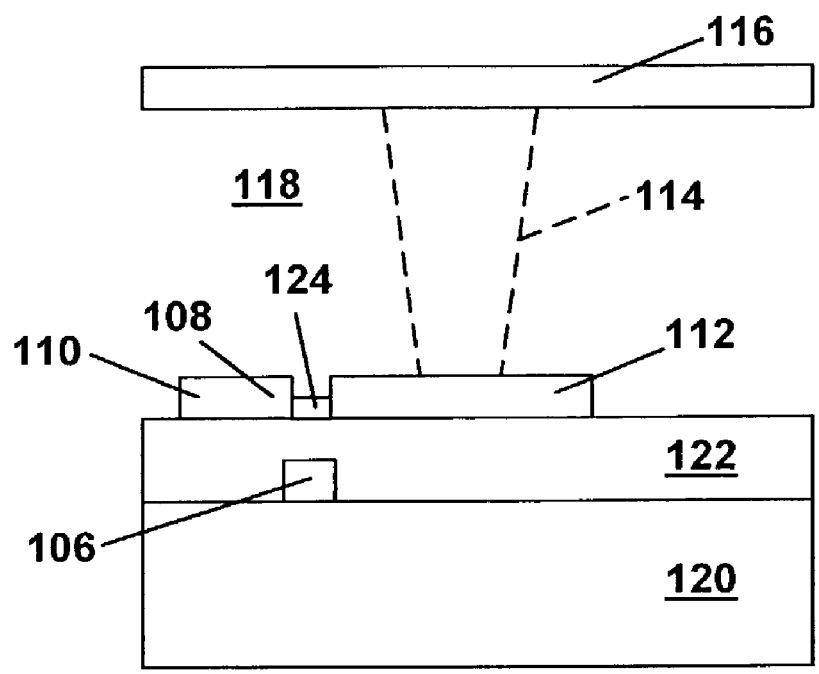
FIG. 1C is a section along line 1C—1C in FIG. 1B.

FIGS. 1A, 1B and 1C illustrate a conventional (registration-intolerant) TFT design, with FIG. 1A being a top plan view of a first patterned metal layer (generally designated 102) of a TFT (generally designated 100—see FIG. 1B) comprising a select line 104 and a gate electrode 106, which has the form of a rectangular area extending at right angles to the select line 104. (In FIGS. 1A and 1B, and in similar Figures below, in order to enable the various layers of the transistor to be more easily distinguished, the metal layer containing the gate electrode is shaded; this shading does not indicate the presence of a cross-section.) As may be seen by comparison with FIG. 1C, FIG. 1A shows the top plan view with the pixel electrode and its associated dielectric layer (see below) removed.

FIG. 1B is a top plan view of the TFT 100 and related components, the TFT 100 including the first patterned metal layer 102 of FIG. 1A. The TFT 100 includes a source electrode 108 (connected to a source line 110), the gate electrode 106 and a drain electrode 112. The source electrode 108 and drain electrode 112 are both formed in a second patterned metal layer. A via 114 connects the drain electrode 112 to a pixel electrode 116 (FIG. 1C); this via is shown in broken lines in FIG. 1C to indicate that, since it lies in front of the plane of FIG. 1C, it would not actually be visible in a true cross-section. The TFT 100 is of the aforementioned buried type, with the pixel electrode 116 overlying the TFT 100 and separated therefrom by a dielectric (insulating) layer 118; in FIG. 1C, and in comparable cross-sections below, for ease of illustration the thickness of this dielectric layer is shown greatly reduced as compared with the thicknesses of the various layers forming the TFT 100.

As shown in FIG. 1C, the TFT 100 is of the bottom gate type, with the first metal layer 102, including the gate electrode 106 formed immediately adjacent a substrate 120. A gate dielectric layer 122 overlies the first metal layer 102, with the second metal layer, including the source electrode 108 and the drain electrode 112, formed above the gate dielectric layer 122. The gap between the source electrode 108 and the drain electrode 112 is filled with an area 124 of doped silicon (omitted from FIG. 1B) which forms the channel of the TFT 100. An equivalent top gate structure is of course possible, although in such a top gate structure it is necessary to ensure that the via 114 is insulated from the gate electrode 106 and its associated select line 104. Also, the TFT 100 could of course be modified to be of a non-buried type, for example by simply extending the drain electrode 112 in the same plane to form the pixel electrode.

The TFT 100 shown in FIGS. 1A–1C is relatively registration intolerant, in that translation of the second patterned metal layer containing the source electrode 108 and the drain electrode 112 with respect to the first patterned metal layer 102 in a left-right direction in FIG. 1B will cause a variation in the gate-drain capacitance.

Figure 2C:
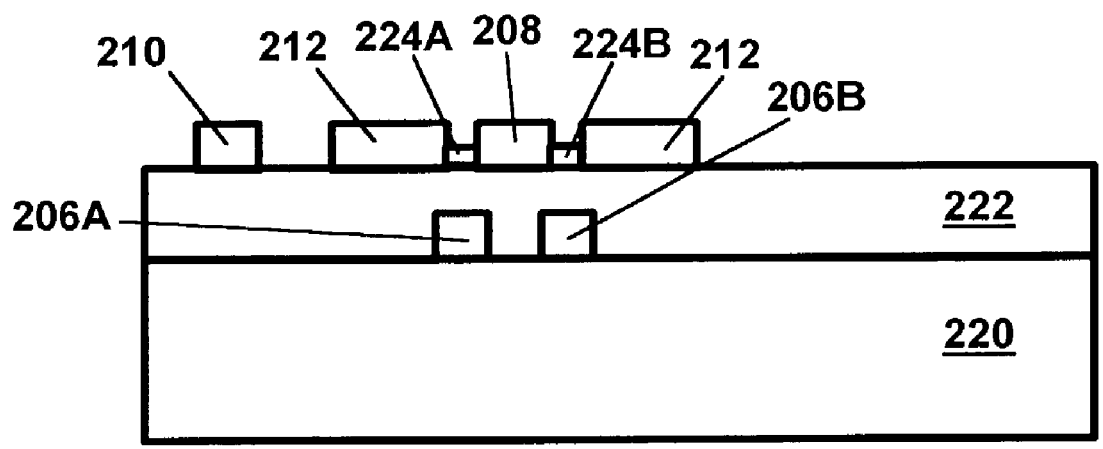
FIG. 2C is a section along line 2C—2C in FIG. 2B.
Figure 2A:
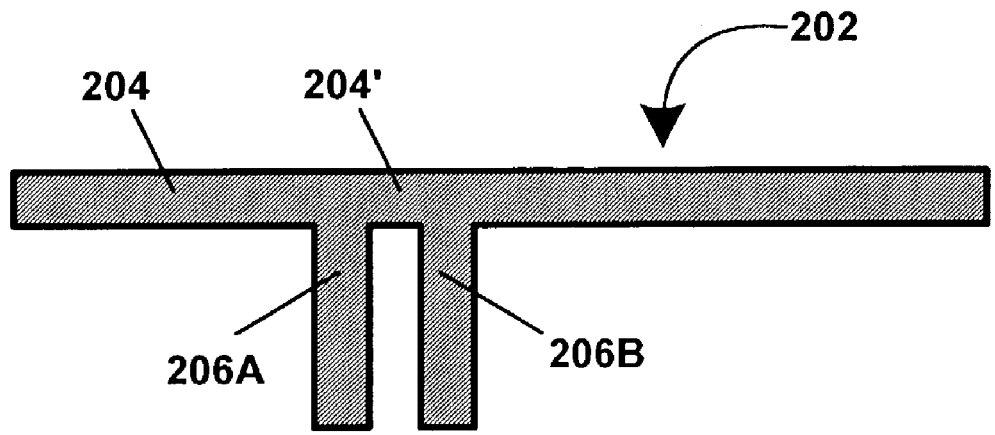
FIG. 2A is a top plan view of a first patterned metal layer forming the gate electrode and associated select line of a registration-tolerant TFT of the present invention.

FIGS. 2A–5 illustrate several registration-tolerant TFT designs of the present invention. FIGS. 2A–2C are views similar to those of FIGS. 1A–1C respectively of a first registration-tolerant TFT (generally designated 200) of the invention.

FIG. 2A is a top plan view of a first patterned metal layer (generally designed 202) of the registration-tolerant TFT 200. The first patterned metal layer 202 includes a select line 204 and a gate electrode, which differs from the gate electrode 106 shown in FIG. 1A in that the gate electrode shown in FIG. 2A has two separate, spaced rectangular sections 206A and 206B extending in the same direction from the select line 204; the portion 204' of the select line 204 lying between the sections 206A and 206B in effect forms a base section of the gate electrode.

Figure 2B:
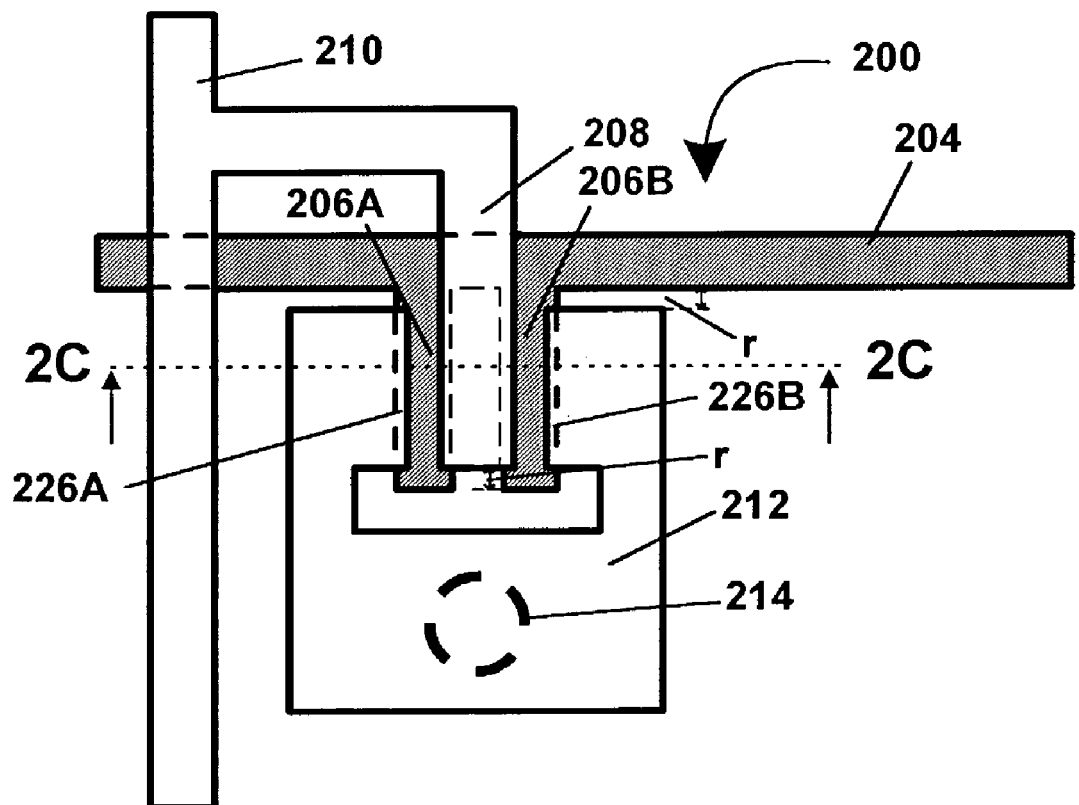
FIG. 2B is a top plan view of the registration-tolerant TFT of the present invention incorporating the first patterned metal layer shown in FIG. 2A.

FIG. 2B is a top plan view of the registration-tolerant TFT 200 and related components, the TFT 200 including the first patterned metal layer 202 of FIG. 2A. The TFT 200 includes a source electrode 208 (connected to a source line 210), the gate electrode 206A, 206B and a drain electrode 212. The source electrode 208 and drain electrode 212 are both formed in a second patterned metal layer. However, it will be seen from FIGS. 2B and 2C that the forms of both the source electrode 208 and the drain electrode 212 are substantially modified from those of the corresponding electrodes shown in FIGS. 1B and 1C. The source electrode 208 is substantially L-shaped so that the end portion thereof extends between the gate electrode sections 206A and 206B, with the lateral edges of the source electrode 208 overlapping the inward edges of the gate electrode sections 206A and 206B (i.e., the edges of these sections 206A and 206B which face the other section). The drain electrode 212 is essentially C-shaped, such that the opening in the C-shape surrounds the end portion of the source electrode 208. The outward edges of the gate electrode sections 206A and 206B form the first and second gate electrode edges of the TFT 200, and the portions of the C-shaped drain electrode 212 adjacent the opening therein overlap these outward edges of the gate electrode sections 206A and 206B to form first and second overlap areas denoted 226A and 226B respectively in FIG. 2B.

As shown in FIG. 2C, the TFT 200 is of the bottom gate type, with the first metal layer 202, including the gate electrode 206A, 206B formed immediately adjacent a substrate 220. A gate dielectric layer 222 overlies the first metal layer 202, with the second metal layer, including the source electrode 208 and the drain electrode 212, formed above the gate dielectric layer 222. The gaps between the source electrode 208 and the adjacent portions of the C-shaped drain electrode 212 are filled with areas 224A, 224B of doped silicon (omitted from FIG. 2B) which form the channels of the TFT 200. The TFT 200 is of the same buried type as the TFT 100 previously described and has a via 214 (FIG. 2B) and a pixel electrode overlying the TFT 200, but both the via 214 and the associated pixel electrode are omitted from FIG. 2C for ease of illustration. An equivalent top gate structure is of course possible, and the TFT 200 could of course also be modified to be of a non-buried type, for example by simply extending the drain electrode 212 in the same plane to form the pixel electrode.

The "double contact drain" design of TFT 200 as described above provides tolerance to misalignments, such as relative translation errors in the direction of the channel length (i.e., horizontally as shown in FIG. 2B) between the two patterned metal layers. Translation of the source-drain metal layer causes an increase in the size of one overlap area 226A or 226B, and hence an increase in the gate-pixel capacitance associated with this overlap area, but this increase is compensated by a balancing decrease in the other overlap area and its associated gate-pixel capacitance. Preferably, the overlap of the gate and the source-drain metal layers (i.e., the horizontal width in FIG. 2B of the overlap areas 226A, 226B) is greater than the expected variation, or desired tolerance, in registration errors.

In the TFT 200, tolerance for registration errors along the channel width direction (i.e., vertically in FIG. 2B) is afforded by forming the gate electrode portions 206A, 206B so that they extend a distance r beyond the source and drain contact regions on either side of the channel. This distance r is preferably greater than the potential translation error. Thus, the value of r can be selected to provide a desired level of misalignment tolerance.

The TFT 200 can have a ratio of channel width to metal overlap that is no greater than for the conventional TFT 100 shown in FIGS. 1A–1C, while providing much better registration tolerance than the conventional design. In preferred embodiments, the minimum TFT aspect ratio has a value of 2, where the aspect ratio is W/L (W is the channel width, and L is the channel length).

Figure 3A:
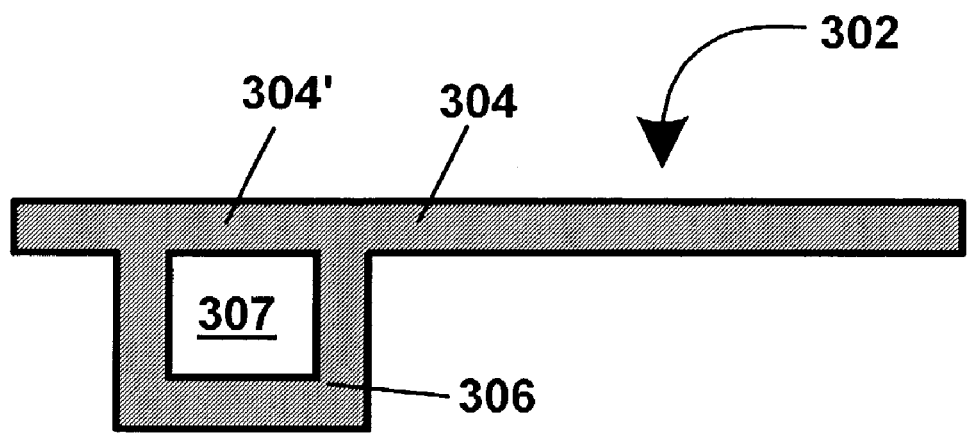
FIG. 3A is a top plan view of a first patterned metal layer forming the gate electrode and associated select line of a second registration-tolerant TFT of the present invention.
Figure 3B:
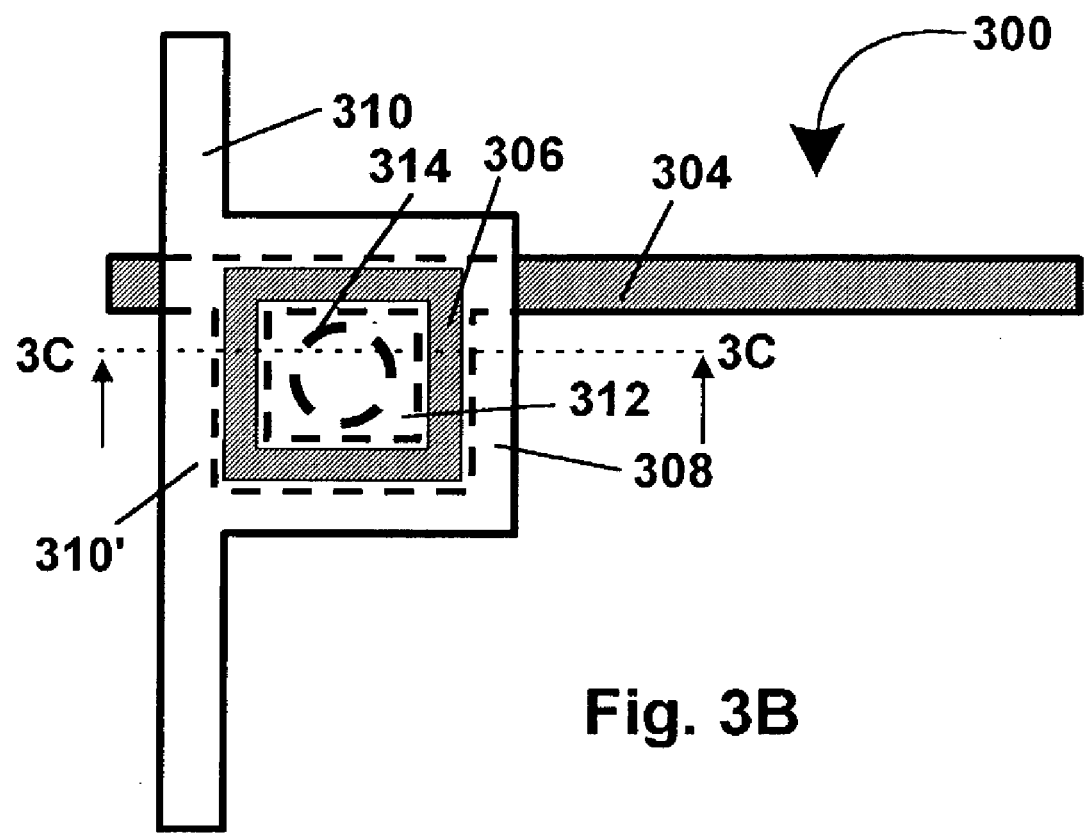
FIG. 3B is a top plan view of the second registration-tolerant TFT of the present invention incorporating the first patterned metal layer shown in FIG. 3A.
Figure 3C:
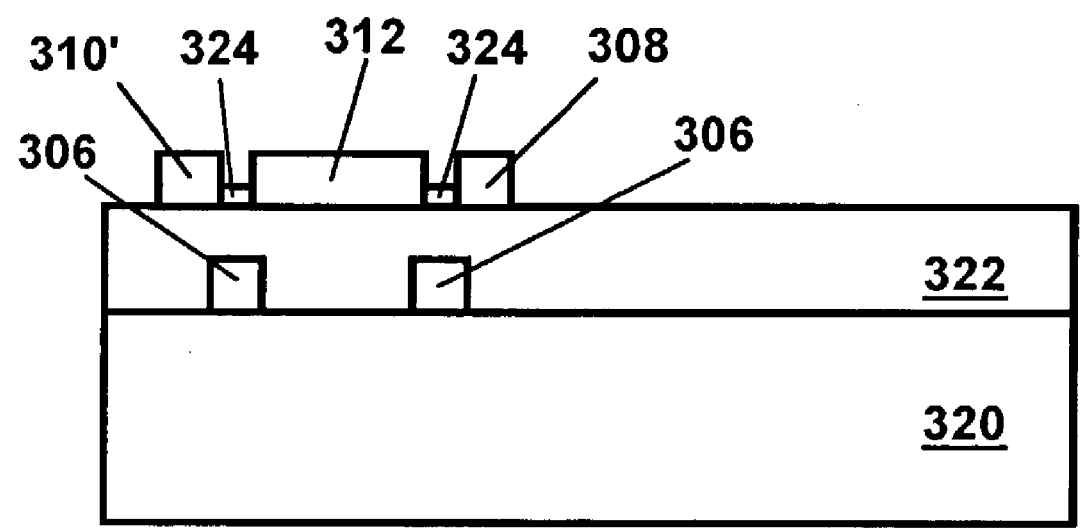
FIG. 3C is a section along line 3C—3C in FIG. 3B.

FIGS. 3A–3C show views of a second registration-tolerant TFT (generally designated 300), these views being similar to the views of FIGS. 2A–2C respectively. FIG. 3A is a top plan view of a first patterned metal layer (generally designed 302) of the registration-tolerant TFT 300. The first patterned metal layer 302 includes a select line 304 and a gate electrode 306, which is substantially U-shaped so that, together with the adjacent section 304' of the select line 304, it provides a hollow rectangular gate electrode having a rectangular central aperture 307.

FIG. 3B is a top plan view of the registration-tolerant TFT 300 and related components, the TFT 300 including the first patterned metal layer 302 of FIG. 3A. The TFT 300 includes a source electrode 308 (connected to a source line 310), the gate electrode 304', 306 and a drain electrode 312. The source electrode 308 and drain electrode 312 are both formed in a second patterned metal layer. However, it will be seen from FIGS. 3B and 3C that the forms of both the source electrode 308 and the drain electrode 312 are substantially modified from those of the corresponding electrodes shown in FIGS. 1B, 1C, 2B and 2C. The source electrode 308 is substantially U-shaped so that, together with the adjacent section 310' of the source line 310, it has the form of a hollow rectangle surrounding but slightly overlapping the outer edges of the gate electrode 304', 306. The drain electrode 312 is rectangular such that its central portion overlies the central aperture 307 of the gate electrode but its peripheral portions extend outwardly beyond the inner edges of the gate electrode which define the central aperture 307. Thus, these inner edges of the gate electrode constitute the gate electrode edges of the TFT 300, while the areas of overlap between the drain electrode 312 and the inner portions of the gate electrode constitute the overlap areas of the TFT. It will be see that, in contrast to the TFT 200 previously described, the TFT 300 may be regarded as having four gate electrode edges (the edges along the four sides of the rectangular aperture 307) and, correspondingly, four overlap areas.

As shown in FIG. 3C, the TFT 300 is of the bottom gate type, with the first metal layer 302, including the gate electrode 304', 306 formed immediately adjacent a substrate 320. A gate dielectric layer 322 overlies the first metal layer 302, with the second metal layer, including the source electrode 308 and the drain electrode 312, formed above the gate dielectric layer 322. The "annular" gap between the source electrode 308 and the drain electrode 312 is filled with an area 324 of doped silicon (omitted from FIG. 3B) which forms the channel of the TFT 300. The TFT 300 is of the same buried type as the TFT's 100 and 200 previously described and has a via 314 (FIG. 3B) and a pixel electrode overlying the TFT 300, but both the via 314 and the associated pixel electrode are omitted from FIG. 3C for ease of illustration. An equivalent top gate structure is of course possible, and the TFT 300 could of course also be modified to be of a non-buried type, for example by connecting the drain electrode 312 by some type of bridge structure to a pixel electrode lying in the same plane as the drain electrode.

It is believed that the reasons for the registration-tolerance of the TFT 300 will readily be apparent to those skilled in the art of transistor design in view of the earlier explanation of the reasons for the registration-tolerance of the TFT 200. It should be noted that, since the TFT 300 is provided with two pairs of overlap areas extending perpendicular to each other (along the two pairs of perpendicular edges of the aperture 307), these two pairs of overlap areas render the TFT 300 tolerant of registration errors along either axis in the plane of FIG. 3B.

Figure 4A:
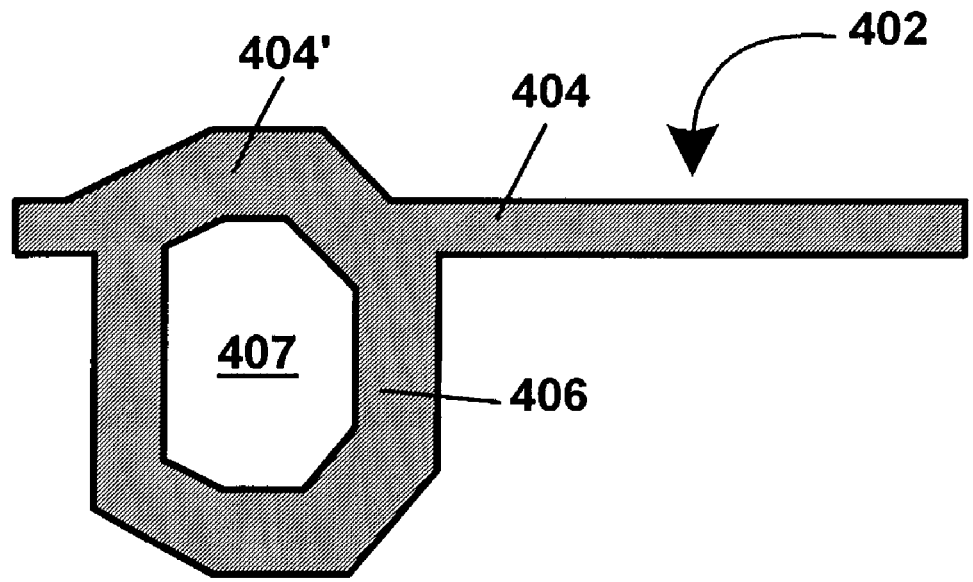
FIG. 4A is a top plan view of a first patterned metal layer forming the gate electrode and associated select line of a third registration-tolerant TFT of the present invention.
Figure 4B:
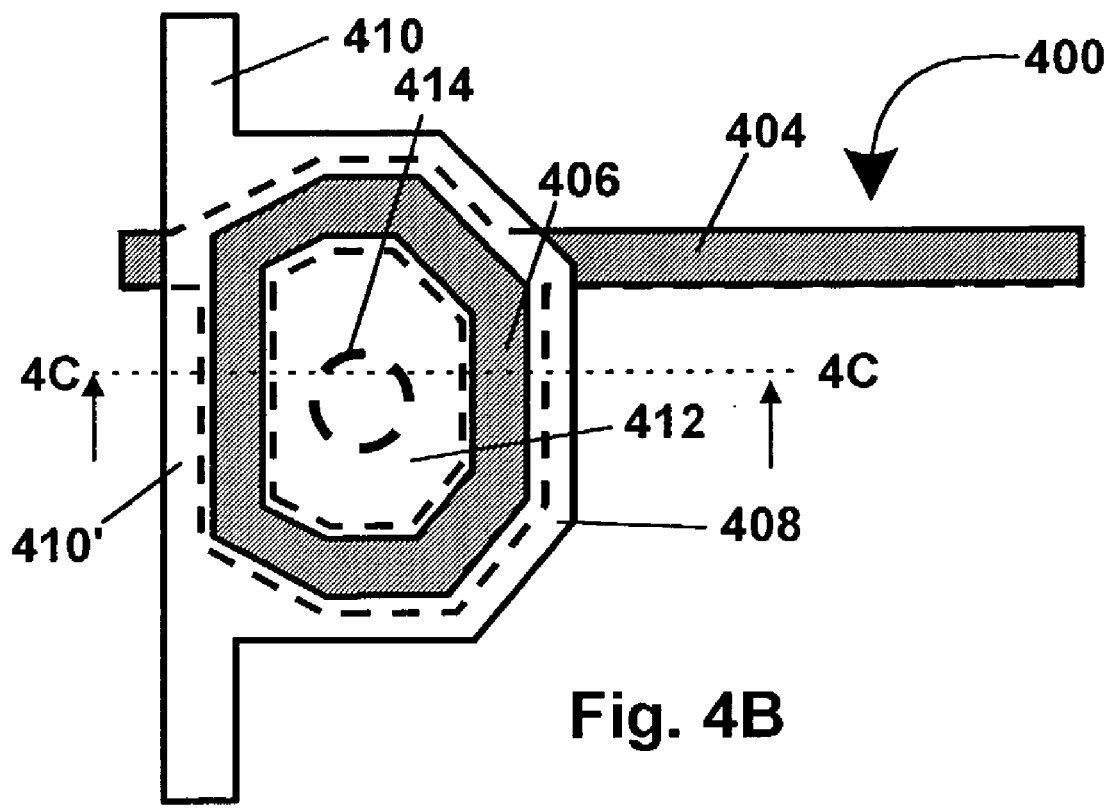
FIG. 4B is a top plan view of the third registration-tolerant TFT of the present invention incorporating the first patterned metal layer shown in FIG. 4A.
Figure 4C:
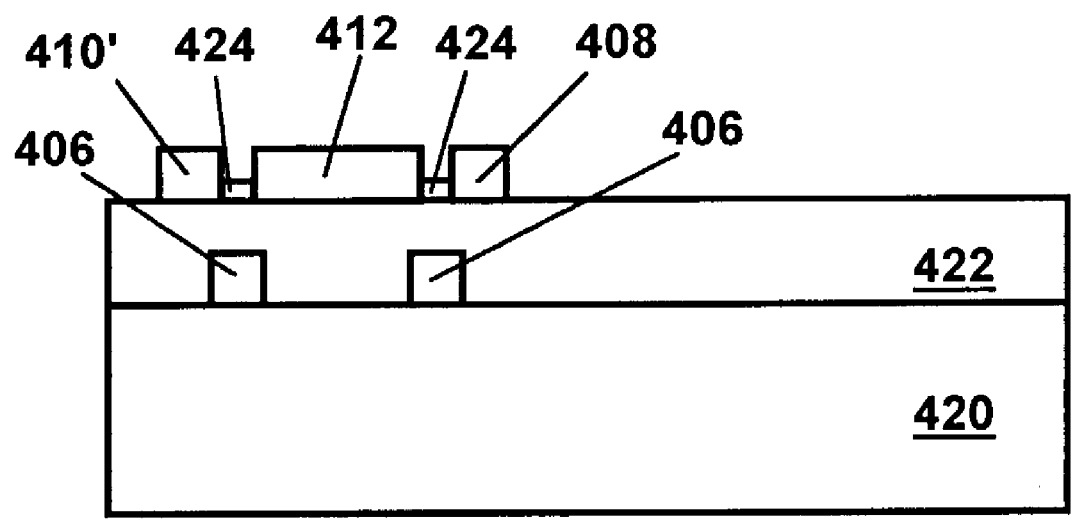
FIG. 4C is a section along line 4C—4C in FIG. 4B.

FIGS. 4A–4C show views of a third registration-tolerant TFT (generally designated 400), these views being similar to the views of FIGS. 3A–3C respectively. The TFT 400 is essentially a minor variation on the TFT 300 previously described in that the TFT 400 uses source, drain and gate electrodes based upon irregular polygons rather than rectangles, as in the TFT 300. FIG. 4A is a top plan view of a first patterned metal layer (generally designed 402) of the registration-tolerant TFT 400. The first patterned metal layer 402 includes a select line 404 and a gate electrode 406, which is shaped so that, together with the adjacent section 404' of the select line 404, it provides a hollow irregular polygonal gate electrode having a central aperture 407. The precise shape of the inner and outer perimeters of the electrodes can of course vary in different embodiments; for example, the shape can be circular, square, ellipsoidal, polygonal, etc.

FIG. 4B is a top plan view of the registration-tolerant TFT 400 and related components, the TFT 400 including the first patterned metal layer 402 of FIG. 4A. The TFT 400 includes a source electrode 408 (connected to a source line 410), the gate electrode 404', 406 and a drain electrode 412. The source electrode 408 and drain electrode 412 are both formed in a second patterned metal layer. It will be seen from FIGS. 4B and 4C that the forms of both the source electrode 408 and the drain electrode 412 are modified from those of the corresponding electrodes shown in FIGS. 3B and 3C. The source electrode 408 is shaped so that, together with the adjacent section 410' of the source line 410, it has the form of a hollow irregular polygon surrounding but slightly overlapping the outer edges of the gate electrode 404', 406. The drain electrode 412 also has the form of an irregular polygon such that its central portion overlies the central aperture 407 of the gate electrode but its peripheral portions extend outwardly beyond the inner edges of the gate electrode which define the central aperture 407. Thus, these inner edges of the gate electrode constitute the gate electrode edges of the TFT 400, while the areas of overlap between the drain electrode 412 and the inner portions of the gate electrode constitute the overlap areas of the TFT. The TFT 400 may be regarded as having multiple gate electrode edges (the edges along the sides of the polygonal aperture 407) and, correspondingly, multiple overlap areas.

As shown in FIG. 4C, the TFT 400 is of the bottom gate type, with the first metal layer 402, including the gate electrode 404', 406 formed immediately adjacent a substrate 420. A gate dielectric layer 422 overlies the first metal layer 402, with the second metal layer, including the source electrode 408 and the drain electrode 412, formed above the gate dielectric layer 422. The "annular" gap between the source electrode 408 and the drain electrode 412 is filled with an area 424 of doped silicon (omitted from FIG. 4B) which forms the channel of the TFT 400. The TFT 400 is of the same buried type as the TFT's 100, 200 and 300 previously described and has a via 414 (FIG. 4B) and a pixel electrode overlying the TFT 400, but both the via 414 and the associated pixel electrode are omitted from FIG. 4C for ease of illustration. An equivalent top gate structure is of course possible, and the TFT 400 could of course also be modified to be of a non-buried type in the same way as the TFT 300 previously described.

It is believed that the reasons for the registration-tolerance of the TFT 400 will readily be apparent to those skilled in the art of transistor design in view of the earlier explanation of the reasons for the registration-tolerance of the TFT's 200 and 300. Again, it should be noted that, since the TFT 400 is provided with multiple overlap areas, it is tolerant of registration errors along either axis in the plane of FIG. 4B.

In the TFT's 300 and 400, it is desirable that the drain electrode overlap the inner edges of the gate electrode by a distance of at least r along the entire length of their relevant edges, where r is the registration error tolerance for any given process. Preferably, the shortest distance between any point on the edge of the gate electrode and any point on the edge of the drain electrode is greater than or equal to r.

Figure 5:
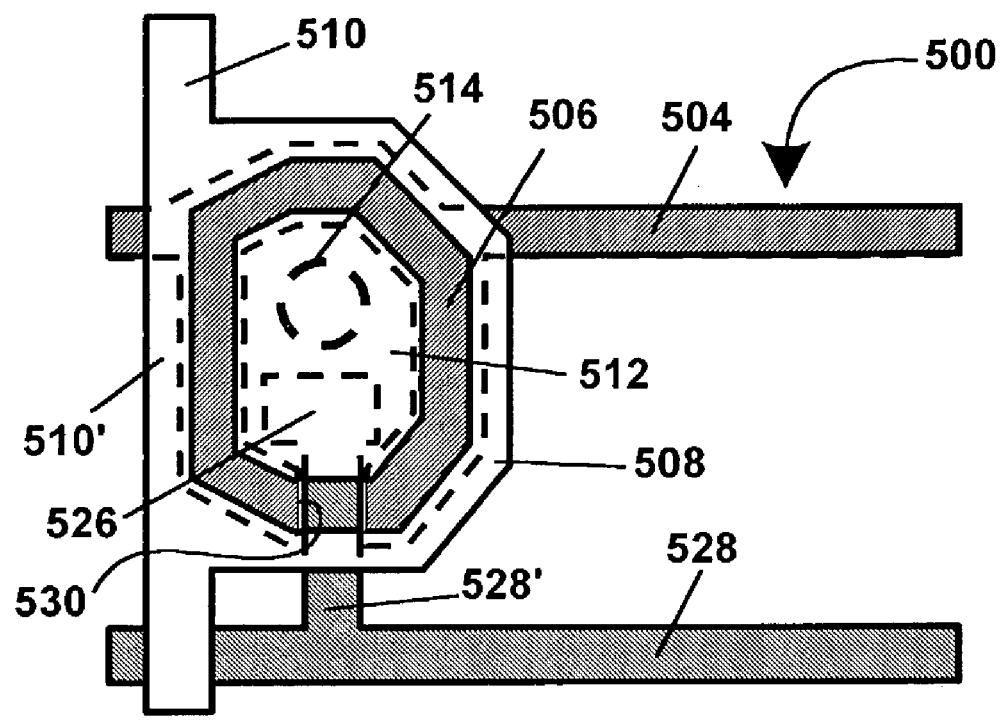
FIG. 5 is a top plan view of a fourth registration-tolerant TFT of the present invention generally similar to that shown in FIGS. 4A–4C but including a capacitor.

FIG. 5 is a top plan view, generally similar to that of FIG. 4B of a fourth registration-tolerant TFT (generally designated 500) of the present invention, this TFT being similar to the TFT 400 previously described but being provided with a storage capacitor.

As shown in FIG. 5, the TFT 500 includes a gate electrode 506, a source electrode 508 and a drain electrode 512. The gate electrode 506 is formed in a first patterned metal layer, while the source electrode 508 and drain electrode 512 are both formed in a second patterned metal layer. The gate electrode 506 and the drain electrode 512 are identical in form to the corresponding electrodes 406 and 412 respectively of the TFT 400 previously described. However, the TFT 500 is modified to include a capacitor electrode 526 and a capacitor electrode line 528, both formed in the first patterned metal layer containing the gate electrode 506. The capacitor electrode 526 underlies the drain electrode 512, and a break 530 in the gate electrode 512 accommodates a capacitor electrode extension 528' which connects the capacitor electrode 526 to the capacitor electrode line 528. The reasons for including a capacitor in a TFT used to drive a non-linear display are explained in the aforementioned copending application Ser. No. 09/565,413 and Publications Nos. 2002/0106847 and 2002/0060321. The capacitor electrode line 528 is typically connected to ground.

The break 530 in the gate electrode 512 can reduce the registration tolerance of the gate-pixel capacitance, though still providing superior tolerance in comparison to conventional TFT designs. Preferably, the size of the break 530 is relatively small in comparison with the size of the gate electrode 512.

Diode Matrix Display Arrays Fabricated with Minimum Photolithography Steps and Printing FIGS. 6A–6C and 7A–7B illustrate diode arrays which can be manufactured by processes of the present invention. These diode arrays can be manufactured by low-cost, high throughput fabrication processes to make large-area diode-matrix-based displays. In some embodiments, diode arrays can are fabricated with use of only one or two lithography steps. The processes are compatible with glass, polyimide, metal foil and other substrate materials. Batch or roll-to-roll processes can be used. The arrays can be used with a variety of display media.

Figure 6A:
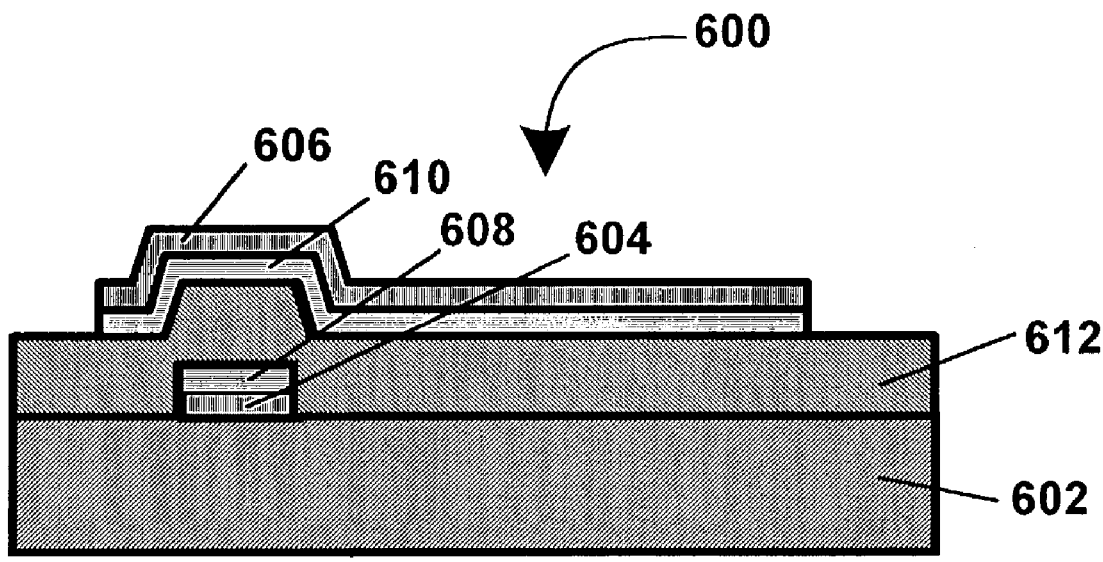
FIGS. 6A and 6B are cross-sections along the x and y axes respectively (as shown in FIG. 6C) of a diode matrix backplane produced by a process of the present invention.
Figure 6B:
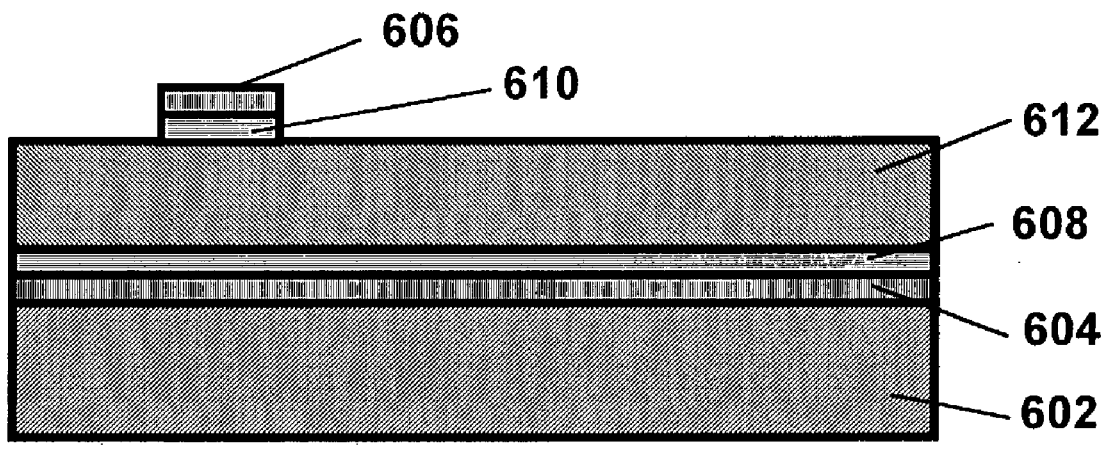
Figure 6C:
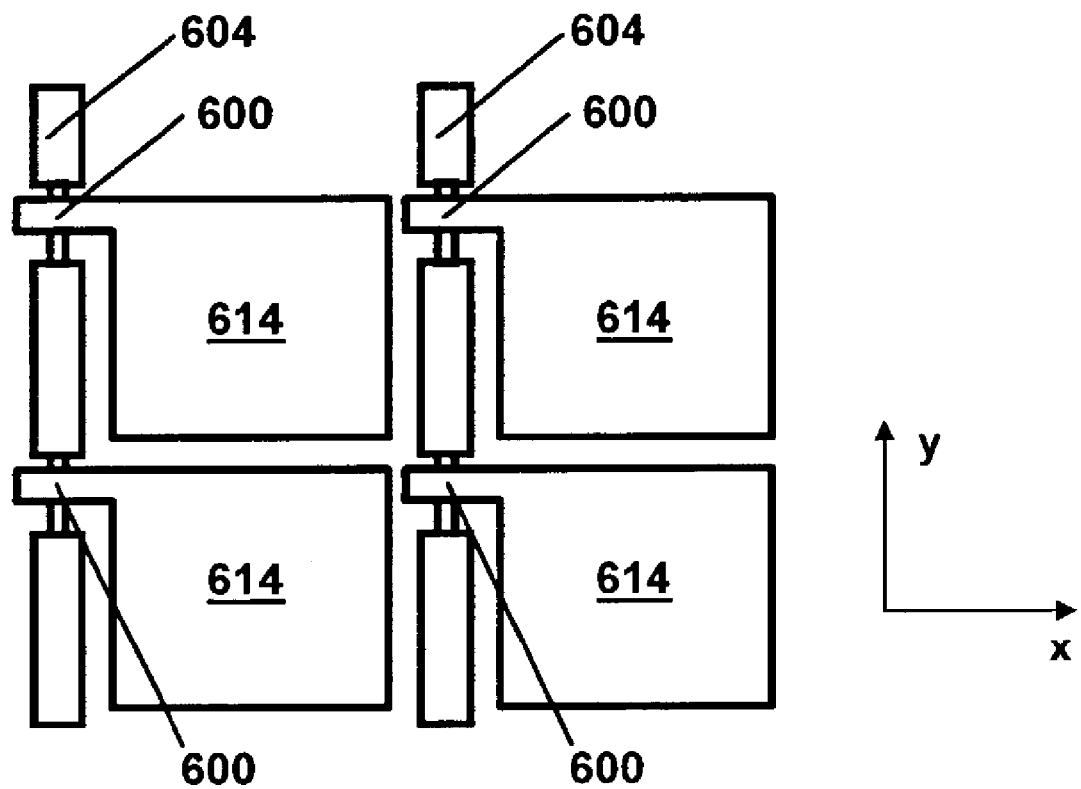
FIG. 6C is a top plan view of the diode matrix backplane shown in FIGS. 6A and 6B.

FIGS. 6A and 6B are cross-sections, along the x and y axes respectively shown in FIG. 6C, of a single diode (generally designated 600) intended for use in a diode matrix backplane array for addressing a display. The diode 600 has an n/i/n structure. Thus, each diode 600 includes a back-to-back pair of diodes, i.e., one n/i and one i/n diode, with the pair sharing the intrinsic layer. The diode 600, which is fabricated on a substrate 602, includes: metal contacts, provided by a patterned metal 1 layer 604 and a patterned metal 2 layer 606; n-type layers, provided by a first patterned n-doped amorphous silicon (n$^+$a-Si) layer 608 and a second patterned n$^+$a-Si layer 610; and an intrinsic, i.e., undoped, a-Si layer 612, which is preferably unpatterned.

FIG. 6C is a top plan view of the patterned metal 1 layer 604 and the patterned metal 2 layer 606, but illustrates an area including four separate diodes 600. The patterned metal 2 layer 606 includes pixel electrodes 614.

The array of diodes 600, in a preferred process, is manufactured by first depositing the metal 1 layer 604 and then the n$^+$a-Si layer 608 on the metal 1 layer 604, both layers being deposited as continuous layers extending over the whole surface of the substrate 602. The metal layer 604 and the n$^+$a-Si layer 608 are then patterned by photolithography to form the patterned metal 1 layer 604 and the patterned first n$^+$a-Si layer 608. Preferably the metal line width at the diode 600 reduced, as compared with the intervening portions of the metal 1 layer, as shown in FIG. 6C, to reduce the capacitance of the diode 600 and the voltage drop of the pixel electrode 614, which is caused by capacitative coupling.

After this first patterning step, the intrinsic a-Si layer 612 is deposited, followed by n$^+$a-Si deposition of layer 610, and then by deposition of metal 2 layer 606; again both layers are deposited as continuous layers extending over the whole exposed surface of the device. A second photolithographic step then serves to pattern the two deposited layer to form the second patterned n$^+$a-Si layer 610 and the patterned metal 2 layer 606.

Alternatively, after the first patterning step and deposition of a continuous n$^+$a-Si layer 610, the metal 2 layer 606 can be formed already patterned by printing, for example, screen printing. The patterned metal 2 layer 606 can then serve as a dry etch mask for patterning of the n$^+$a-Si layer to form the second patterned n$^+$a-Si layer 610. Hence, the diode 600 can be formed with either only one or with two photolithography steps.

Use of two photolithography steps can provide higher resolution feature dimensions than use of a single photolithography step in combination with a printing step. Thus, the former approach can provide smaller diodes for higher resolution displays, while the latter can provide relatively lower cost, lower resolution displays. Either approach can provide relatively easy alignment between the two patterning steps.

Figure 7A:
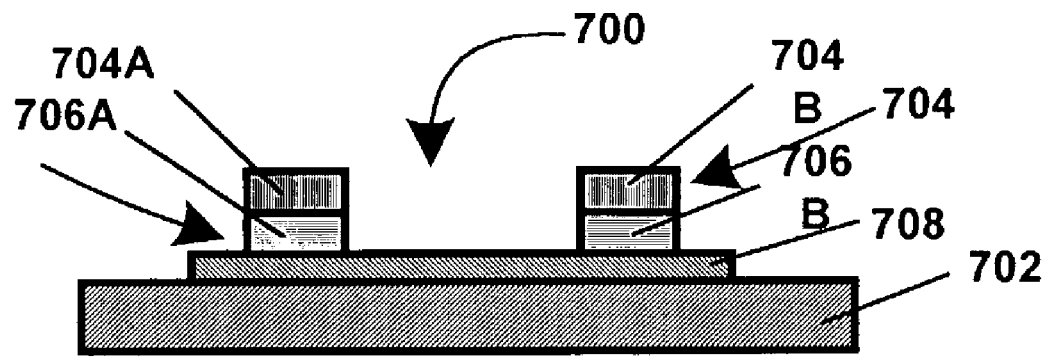
FIG. 7A is a cross section along the x axis (as shown in FIG. 7B) of a second diode matrix backplane produced by a process of the present invention.
Figure 7B:
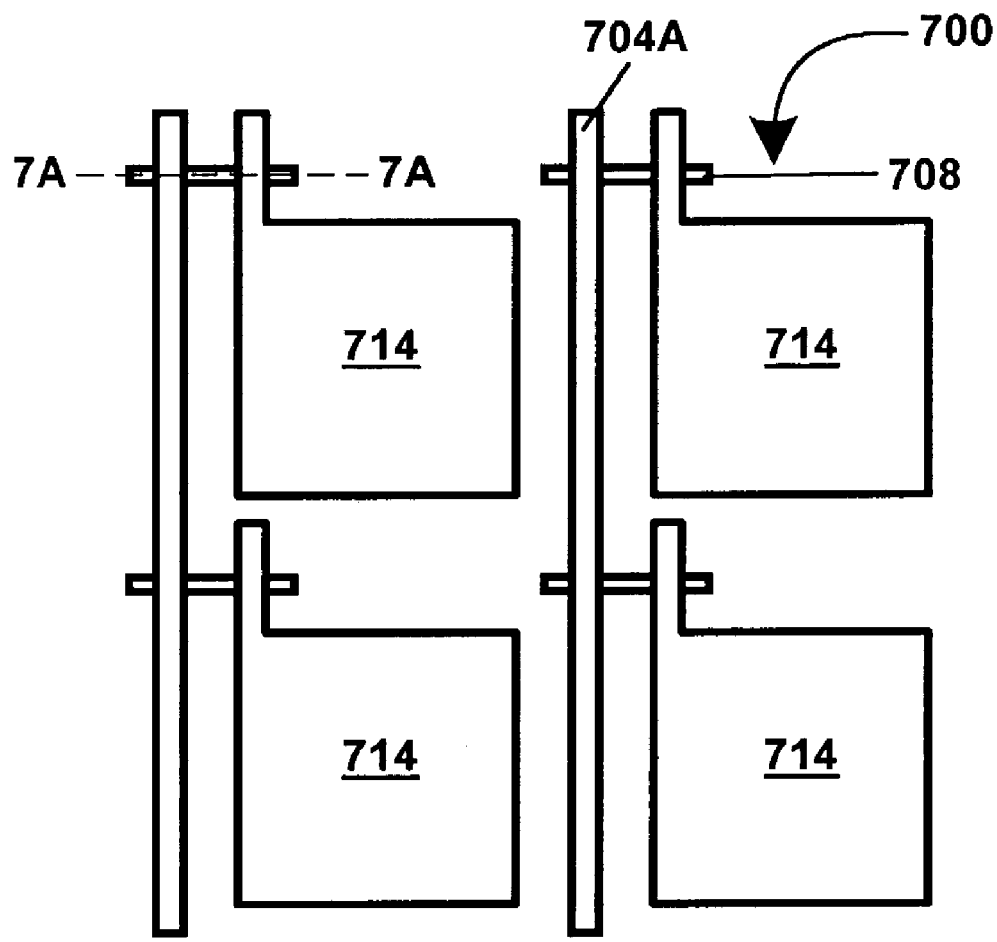
FIG. 7B is a top plan view of the second diode matrix backplane shown in FIG. 7A.

FIG. 7A is a cross-section, taken along the line 7A—7A in FIG. 7B, if a single second diode (generally designated 700) intended for use in a diode matrix backplane array for addressing a display. The diode 700 has a i/n/i structure. Thus, each diode 700 includes a back-to-back pair of diodes, i.e., one i/n and one n/i diode, with the pair sharing the n-type layer. The diode 700, which is fabricated on a substrate 702, includes: metal contacts, provided by two spaced areas 704A, 704B of a single patterned metal layer 704; two spaced areas 706A, 706B of a patterned intrinsic a-Si layer 706, these areas 706A, 706B providing two intrinsic a-Si portions for the back-to-back diodes; and patterned n$^+$a-Si layer 708.

FIG. 7B is a top plan view of the patterned metal layer 704 and the patterned n$^+$a-Si layer 708, but illustrates an area including four separate diodes 700. The patterned metal layer 704 includes pixel electrodes 714.

The array of diodes 700, in a preferred process, is manufactured by first depositing a continuous n⁺a-Si layer on the substrate 702, and then patterning this n⁺a-Si layer to form the patterned n⁺a-Si layer 708. Preferably, the line width of the patterned n⁺a-Si layer 708 is minimized to reduce the capacitance of the diode 700 by minimizing the area of the back-to-back diodes.

After this first patterning step, the intrinsic a-Si layer 706 and the metal layer 704 may be deposited in continuous form. A second photolithographic step then serves to form the patterned intrinsic a-Si areas 706A, 706B and the patterned metal areas 704A, 704B. As is well known to those skilled in semiconductor device technology, care must be exercised in selecting materials for an ohmic metal in contact with intrinsic a-Si.

Alternatively, after formation of the intrinsic a-Si layer 706, the patterned metal areas 704A, 704B can be formed already patterned by printing. The patterned metal areas 704A, 704B can then serve as a dry etch mask for patterning of the intrinsic a-Si layer 706 to form the intrinsic a-Si areas 706A, 706B. Hence the diode 700 can be formed with either only one or with two photolithography steps.

As described above with regard to the diode 600, in the manufacture of the diode 700, use of two photolithography steps can provide higher resolution feature dimensions than use of a single photolithography step in combination with a printing step. Thus, the former approach can provide smaller diodes for higher resolution displays, while the latter can provide relatively lower cost, lower resolution displays. Either approach can provide relatively easy alignment between the two patterning steps.

Figures 8A, 8B:
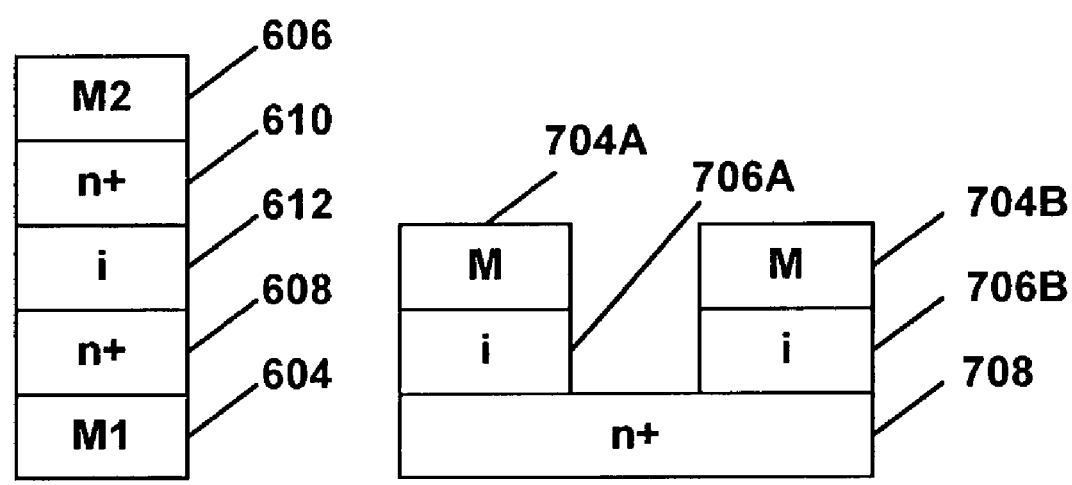
FIG. 8A is a block diagram of the structure of the n/i/n back-to-back diode shown in FIGS. 6A–6C.
FIG. 8B is a block diagram of the structure of the i/n/i back-to-back diode shown in FIG. 7A and 7B.

FIGS. 8A and 8B are simple block diagrams which illustrate the structure of the back-to-back diodes shown in FIGS. 6A–6C and 7A–7B respectively. FIG. 8A depicts the linear configuration of the n/i/n back to back diodes, with metal contacts, while FIG. 8B illustrates the U-shaped configuration of the i/n/i back-to-back diodes.

The processes described above with reference to FIGS. 6–8 can be modified to form Schottky diodes for use with electro-optic displays and in other applications. If the two n⁺a-Si layers 608 and 610 are omitted from the diode shown in FIGS. 6A–6C, the resultant structure forms a vertical Schottky diode. As already described with reference to FIGS. 6A–6C, the Schottky diode array can be fabricated using either two photolithography steps for small-area diodes and high resolution displays, or one photolithography step and one screen-printing step for large-area diodes and low resolution displays. In both cases the alignment between the two patterning steps are very easy.

Some electro-optic materials, such as some encapsulated electrophoretic materials, may require a driving voltage larger than that can be provided by one back-to-back Schottky diode structure. Such materials may, however, be driven by a structure having two connected back-to-back diodes. Such a back-to-back diode structure may be provided by modifying the structure shown in FIGS. 7A and 7B by replacing the n⁺a-Si layer 708 with a metal (or other conductive) layer. Again, the diode-matrix array can be fabricated using either two photolithography steps for small-area diodes and high resolution displays, or one photolithography step and one screen-printing step for large-area diodes and low resolution displays. In both cases the alignment between the two patterning steps are very easy. Thus, this invention can provide a low-cost, high throughput fabrication process for large-area diode-matrix Schottky diode driven displays, compatible with glass, polyimide or metal foil substrates. The diode structure can be manufactured by either batch or roll-to-roll fabrication process. The diode-matrix Schottky diode m/i/m arrays thus produced can be used for all types of diode-matrix displays.

Backplane Designs with Reduced Source Line Coupling
A: Screened Source Line Backplanes As already mentioned, in another aspect this invention provides backplane designs with reduced source line coupling, i.e., reduced source line to pixel electrode coupling. These backplanes are of two main types, namely screened source line backplanes and balance line backplanes and the two types will hereinafter be described separately, although a single backplane could, if desired, make use of both these aspects of the invention. First, however, for purposes of comparison, a prior art backplane intended for use with a reflective electro-optic display will be described with reference to FIGS. 9A and 9B.

Figure 9B:
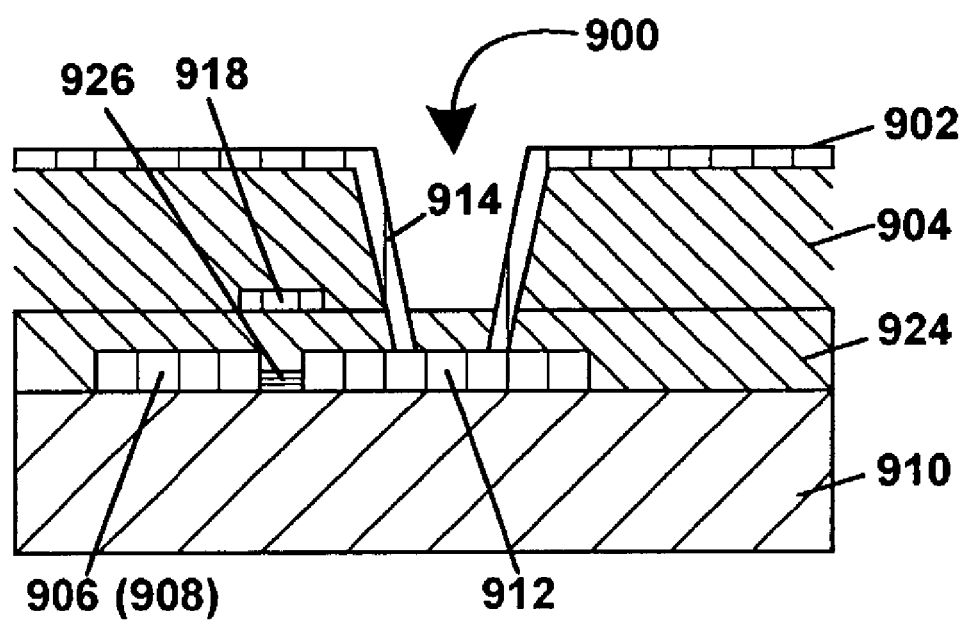
FIG. 9B is a cross-section along line 9B—9B in FIG. 9A.
Figure 9A:
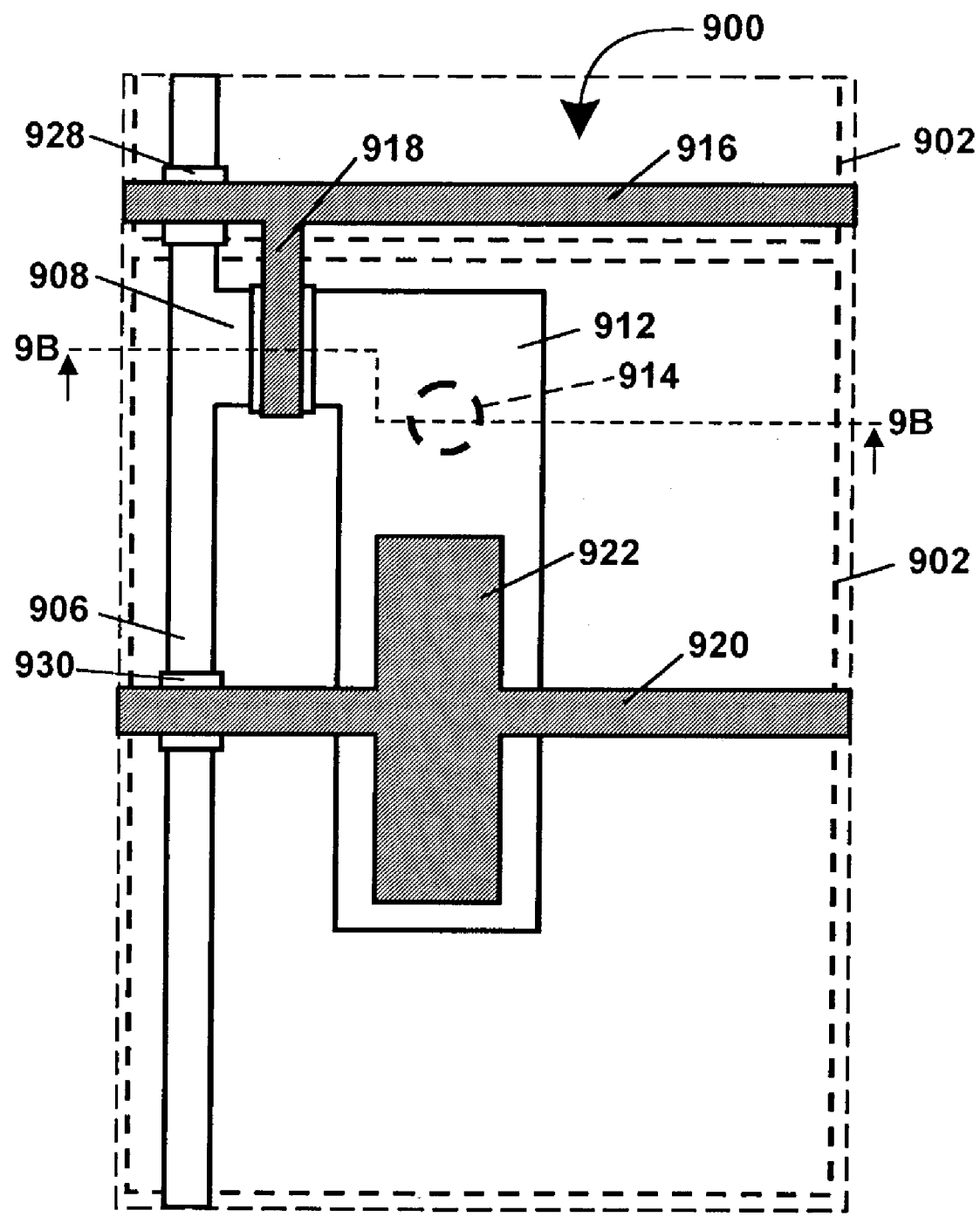
FIG. 9A is a top plan view of a typical TFT pixel unit of a reflective active matrix prior art display, in which various components buried under a pixel electrode.

FIG. 9A is a top plan view of a typical single TFT pixel unit (actually a major part of one pixel unit and a minor part of an adjacent pixel unit) comprising one TFT (generally designated 900) of a backplane intended for use with a reflective electro-optic display, while FIG. 9B is a cross-section along the line 9B—9B is FIG. 9A. As perhaps best seen in FIG. 9B, the TFT 900 is of the buried type and includes components buried under a pixel electrode 902 having an associated dielectric layer 904. The TFT 900 has a top-gate structure and a first patterned conductive layer, formed on a substrate 910, and including: a source line 906; a source electrode 908, which extends from the source line 906; and a drain electrode 912. A via 914 connects the drain electrode 912 to the pixel electrode 902 and passes through the dielectric layer 904.

The TFT 900 further includes a second patterned conductive layer that includes: a select line 916; a gate electrode 918, which extends from the select line 916; a capacitor line 920; and a capacitor electrode 922, which extends across the capacitor line 920. The capacitor line 920 and capacitor electrode 922 serve essentially the same functions in the TFT 900 as do the capacitor line 528 and capacitor electrode 526 of the TFT 500 shown in FIG. 5, as already discussed above.

The TFT 900 further comprises a gate dielectric layer 924 (see FIG. 9B) and semiconductor area 926 disposed between the source electrode 908 and the drain electrode 912 and forming the channel of the TFT 900. However, the TFT 900 also comprises an inter-metal bridge dielectric portion 928 disposed between the overlapping portions of the select line 916 and the source line 906, and another inter-metal bridge dielectric portion 930 disposed between the overlapping portions of the capacitor line 920 and the source line 906. These bridge dielectric portions are optional but desirable, since they increase the vertical spacing (as illustrated in FIG. 9B) between the overlapping portions of the source, capacitor and select lines, and thereby reduce the capacitive coupling between these lines.

Figure 10:
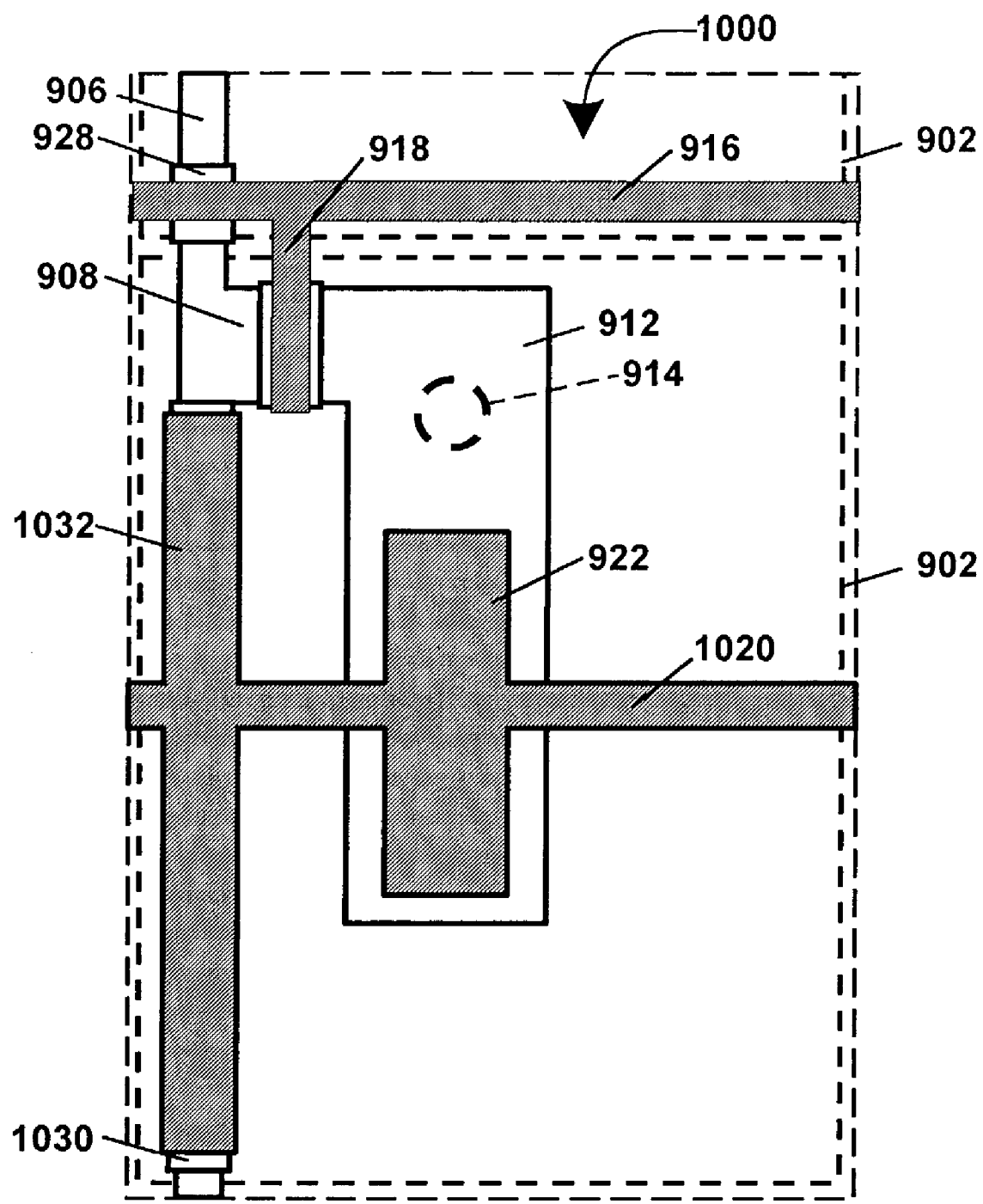
FIG. 10 is a top plan view, similar to that of FIG. 9A, of a TFT pixel unit of a screened source line backplane of the present invention.

FIG. 10 is a top plan view, similar to that of FIG. 9A, of a single TFT pixel unit comprising one TFT (generally designated 1000) of a backplane which closely resembles the TFT 900 already described with reference to FIGS. 9A and 9B, but which has a screened source line in accordance with the present invention. Since most of the integers of the TFT 1000 are identical to the corresponding integers of the TFT 900, they are given the same reference numerals and will not be further described. However, the capacitor line 1020 of TFT 1000 is modified by the provision thereon of a conductive portion or screening electrode 1032, which has a width slightly greater than the width of the source line 906 and which overlies approximately 80 percent of the portion of the source line 906 which is covered by the pixel electrode 902. The TFT 1000 is also provided with a bridge dielectric portion 1030, which is substantially larger than the corresponding bridge dielectric portion 930 of the TFT 900 (FIG. 9A), so that the bridge dielectric portion 1030 covers all the area of overlap between the screening electrode 1032 and the source line 906. The presence of the screening electrode 1032 greatly reduces the capacitative coupling between the source line 906 and the pixel electrode 902.

In preferred embodiments of the screened source line backplanes of the present invention, the screening electrode covers a significant part (typically at least 30 per cent, desirably at least 80 percent and preferably at least 90 percent) of, or the entire part of, the source line under the pixel electrode. Thus, little or none of the source line electrostatically couples to the pixel electrode; and the capacitance between the source line and pixel electrode is reduced or almost eliminated using this design.

The fraction of the source line which is necessary or desirable to cover is governed by the tolerance for pixel voltage shifts caused by source line capacitative coupling. For example, if the voltage shift due to capacitative coupling causes a 100 mV voltage shift to the pixel electrode, and if such voltage shifts should be below a value of 20 mV to avoid induced optical artifacts, then covering 80% of the portion of the source line under the pixel electrode would avoid the artifacts, since such coverage would reduce the capacitative coupling to about 20% of its original value, and so capacitative voltage shifts would be reduced by approximately 80%, to approximately 20 mV. If the tolerance for voltage shifts was at 50 mV instead of 20 mV, then only approximately half of the source line would need to be covered by the screening electrode.

Some screened source line backplanes of the present invention may increase the source line capacitance. Although the presence of the screening electrode can eliminate, or greatly reduce, source line to pixel electrode capacitance, it can increase source line to storage capacitor electrode capacitance. The latter increase occurs because the dielectric between the source line and the screening electrode is thinner than the dielectric between the pixel electrode and the source line, thus leading to a display that requires more power to scan.

B. Balance Line Backplanes

As already indicated one aspect of the present invention relates to backplanes containing balance lines to reduce voltage shifts due to source line/pixel electrode coupling. Balance line backplanes suitable for use with reflective displays will now be described with reference to FIGS. 11–13, while a balance line backplane suitable for use with a transmissive display will be described with reference to FIG. 15.

Figure 11:
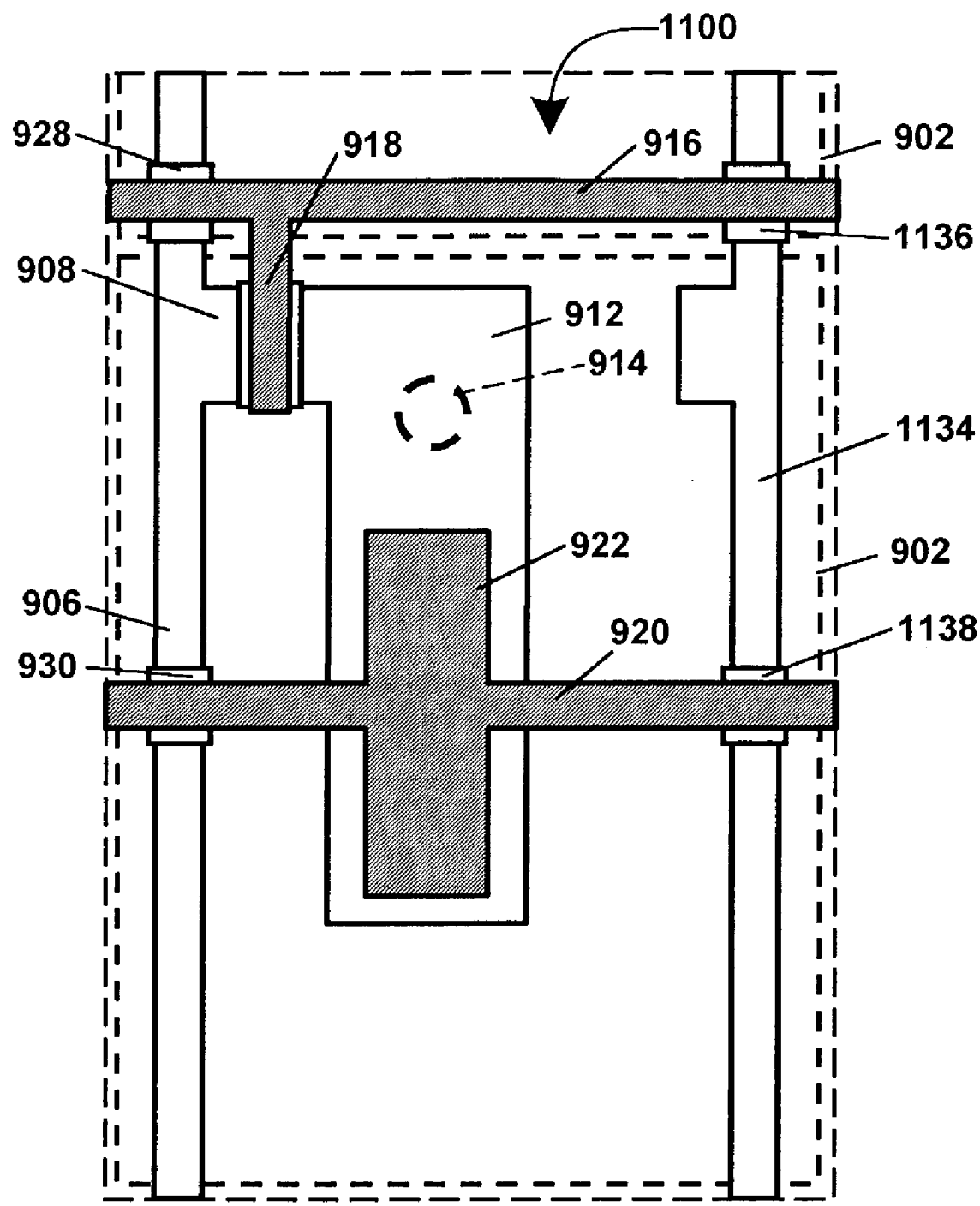
FIG. 11 is a top plan view, similar to that of FIG. 9A, of a TFT pixel unit of a first balance line backplane of the present invention.

FIG. 11 is a top plan view, similar to that of FIG. 9A, of a single TFT pixel unit comprising one TFT (generally designated 1100) of a backplane which closely resembles the TFT 900 already described with reference to FIGS. 9A and 9B, but which has a balance line in accordance with the present invention. Since most of the integers of the TFT 1100 are identical to the corresponding integers of the TFT 900, they are given the same reference numerals and will not be further described. However, the TFT 1100 is provided with a balance line 1134, which runs parallel to the source line 906, and inter-metal bridge dielectric portions 1136 and 1138 which are generally similar to the dielectric portions 928 and 930 respectively shown in FIG. 9A, but are disposed between the overlapping portions of the balance line 1134 with the select line 906 and the capacitor line 920 respectively.

In preferred balance line backplanes of the present invention, a balance line parallels each source line in the backplane. Thus, for each source line, there is a balance line whose voltage is chosen to be a function of the source line voltage.

In preferred balance line backplanes, including that shown in FIG. 11, the capacitance between the pixel electrode and the source line for all pixels lying above the source line is counter-matched (i.e., negated) by the capacitance between the balance line and the same pixel electrode. This matching can be achieved, for example, by using a balance line that has the same shape as the source line. The balance line can alternatively be a mirror image of the source line, including any protuberance that forms a source electrode of a pixel transistor, as illustrated in FIG. 11.

The voltage shift, $\Delta V_{par}$, on a pixel electrode caused by voltage shifts on the source and balance lines can be expressed as:

$$\Delta V_{par} = \frac{C_{source}}{C_{total}} \Delta V_{source} + \frac{C_{bal}}{C_{total}} \Delta V_{bal} \qquad (1)$$

where $\Delta V_{source}$ is a voltage shift on the source line, $\Delta V_{bal}$ is a voltage shift on the balance line, and $C_{total}$ is the total capacitance to the pixel electrode, including the pixel capacitance to the top plane, the storage capacitance, and all parasitic capacitances to other conductors on the backplane such as to the source and balance lines. When the capacitance between the underlying source and balance lines are the same, then Equation (1) can be expressed as:

$$\Delta V_{par} = \frac{C_{source}}{C_{total}} (\Delta V_{source} + \Delta V_{bal}) \qquad (2)$$

Figure 12:
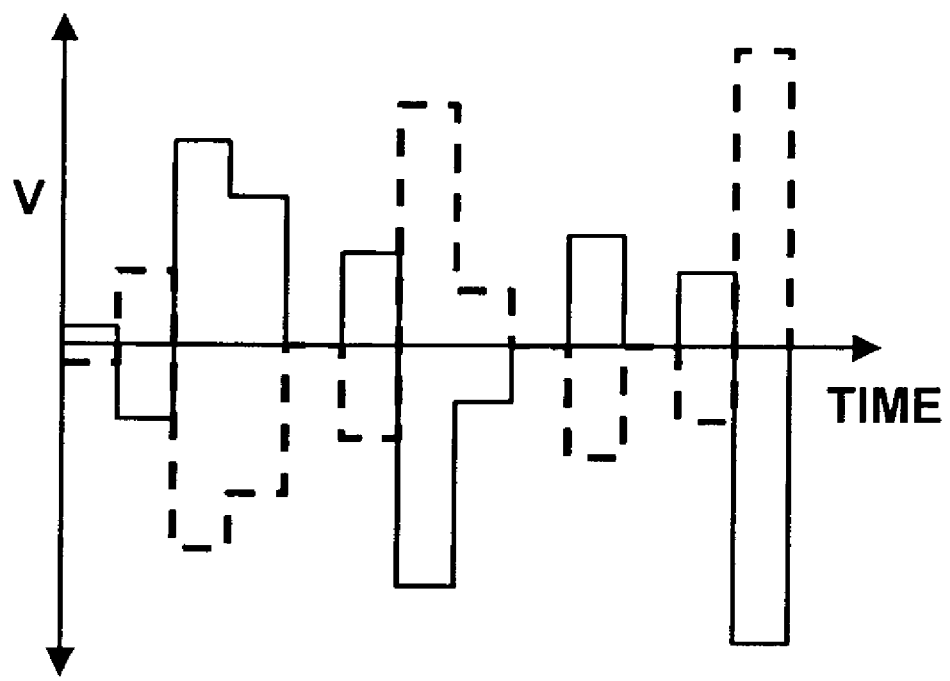
FIG. 12 a graph showing the variations with time of the voltages applied to the source line and balance line during operation of the first balance line backplane shown in FIG. 11.

FIG. 12 is a graph showing one set of source line (full line) and balance line (broken line) voltages which may be used in the backplane of FIG. 11. Parasitic voltage shifts to the pixel electrode can be eliminated by shifting the balance line voltage by an amount equal to all source line voltage shifts but in the opposite direction. For example, the balance line could be run at the reverse voltage to the source line, as shown in FIG. 12.

The power requirement to drive an electro-optic display includes several terms such as:

$$P = P_{source} + P_{select} + P_{resisive} + P_{driver} \qquad (3)$$

where $P_{source}$ is the power required to switch the source lines, $P_{select}$ is the power to switch the select line, $P_{resistive}$ is the power due to the current flow through the electro-optic layer, and $P_{driver}$ is the power absorbed in the drivers aside from the power required to charge and discharge source and select lines.

For displays using highly resistive electro-optic medium, for example liquid crystals and electrophoretic media, the dominant term in the power requirement is usually the source line power because the source lines are switched much more frequently than the select lines. Incorporation of balance lines introduces an additional term in the power equation, so that Equation (3) becomes:

$$P = P_{source} + P_{bal} + P_{select} + P_{resisive} + P_{driver} \qquad (4)$$

where $P_{bal}$ is the power consumed in the balance lines. Additional contributions, such as resistive line losses, are not explicitly shown. For the scheme described above, $P_{source}$ and $P_{bal}$ are the same, so the power requirement is given by:

$$P = 2P_{source} + P_{select} + P_{resisitve} + P_{driver} \qquad (5)$$

which is almost double the power requirement when balance lines are not present.

Figure 13:
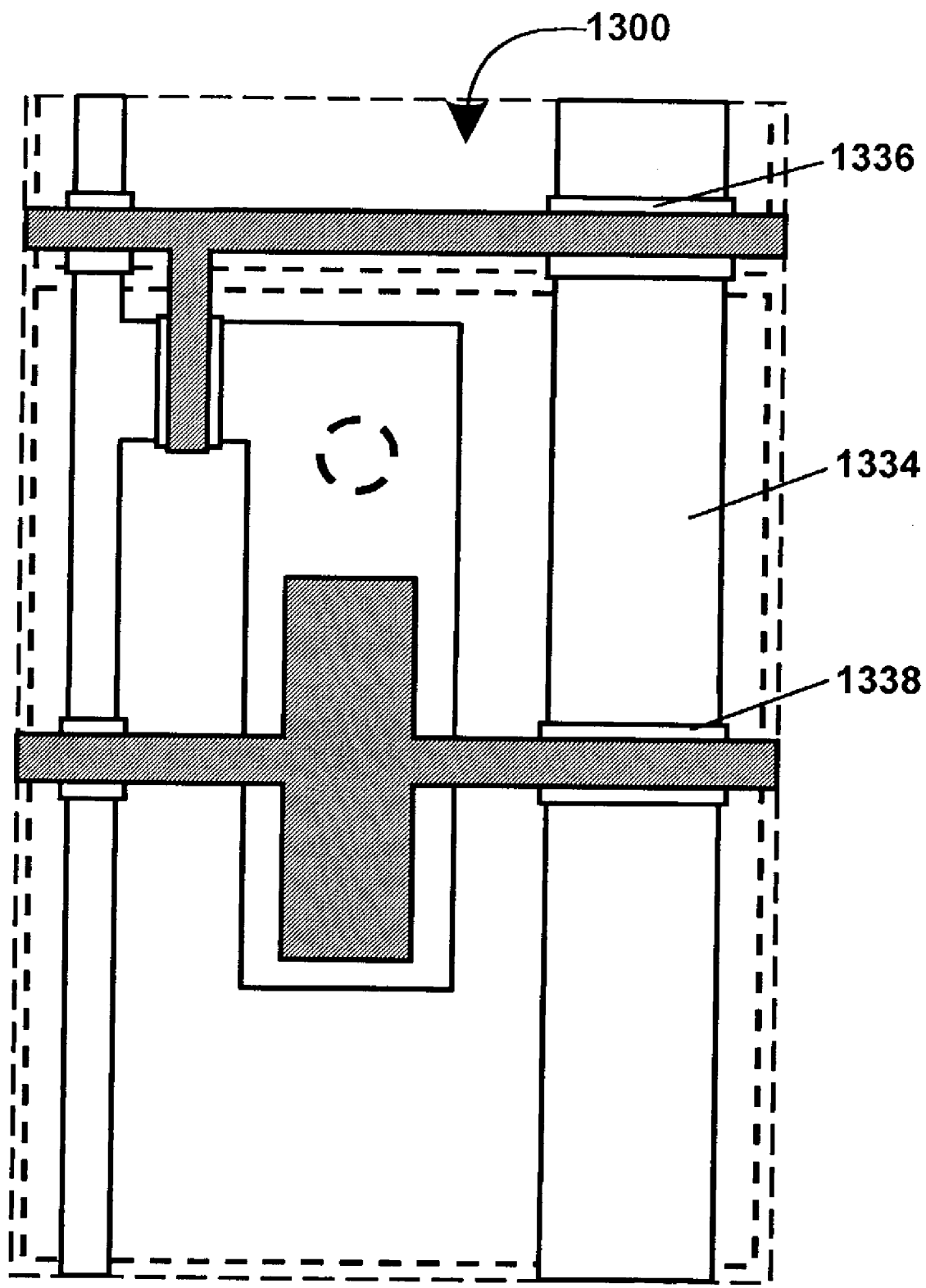
FIG. 13 is a top plan view, similar to that of FIG. 11, of a TFT pixel unit of a second balance line backplane of the present invention, in which the balance line is wider than the source line.

FIG. 13 is a top plan view, similar to that of FIG. 11, of a pixel unit of a second balance line backplane of the present invention which offer very significant reduction in power usage as compared with the backplane of FIG. 11. The backplane of FIG. 13 includes a balance line with a capacitance to the overlying pixel electrode that is larger than the source line-to-pixel electrode capacitance.

FIG. 13 shows a TFT (generally designated 1300), which includes a balance line 1334 that is wider than the balance line 1134 shown in FIG. 11. The TFT 1300 also includes bridge dielectric portions which are increased in size to cover the increased overlapping areas of the balance line 1334 with the select line 916 and the capacitor line 920. The balance line 1334 has a capacitance to the overlying pixel electrode which is approximately four times as large as that of the balance line 1134.

Because of the relation:

$$C_{bal} = 4 C_{source} \qquad (6)$$

Equation (1) can be re-written as:

$$\Delta V_{par} = \frac{C_{source}}{C_{total}}(\Delta V_{source} + 4\Delta V_{bal}) \qquad (7)$$

From this Equation (7) it will be seen that the pixel electrode 902 will experience no voltage shifts if, for every voltage shift in the source line 906, the balance line voltage is shifted by a quarter of the amount in the opposite direction. Capacitative energy upon a voltage shift $\Delta V$ is given by:

$$E_{capacitive} = \frac{1}{2}C(\Delta V)^2 \qquad (8)$$

where C is the capacitance.

The power consumed in switching a balance line (such as that shown in FIG. 11) where $C_{bal}$ equals $C_{source}$ is four times as large as the power consumed in the case (FIG. 13) where $C_{bal}$ is four times $C_{source}$. While the balance line capacitance is four times larger in the latter, the square of the voltage shift will be sixteen times smaller, so the power consumed in the balance line will decrease by a factor of four. The total power consumed by the display of FIG. 13 will be approximately $$P = P_{source} + P_{bal} + P_{select} + P_{resisitve} + P_{driver} + \ldots$$
$$= 1.25 P_{source} + P_{select} + P_{resisitve} + P_{driver} \qquad (9)$$

which is a significant improvement over the FIG. 11 case where $C_{bal} = C_{source}$.

These conclusions can be generalized to any ratio of $C_{bal}$ to $C_{source}$. In general, if $C_{source} = rC_{bal}$ then preferably the balance line voltage follows the source voltage according to:

$$V_{bal} = -\frac{1}{r}V_{source} + k \qquad (10)$$

where k is a constant. The balance line power will be:

$$P_{bal} = \frac{1}{r}P_{source} \qquad (11)$$

and the total display power consumption will be:

$$P = \left(1 + \frac{1}{r}\right)P_{source} + P_{select} + P_{resisitve} + P_{driver} \qquad (12)$$

which can, for large r, be made very close to the power consumption in the absence of the balance line.

Operation of a balance line backplane of this invention is not limited to the above method, in which the voltage of the balance line is a fraction (1/r) of the source line voltage as shown by Equation (10). One can choose a set of voltages for the balance line that map to the voltages available to the source line. The balance line voltage is then set according to the map between the available source line voltages and the set of balance line voltages.

For example, if the source line voltages available are 0, 0.5V, 1.0V, 1.5 V, ..., 9.5V, 10.0V, one could choose a value of 4 for r, and a set of voltages between 0V and 2.5V for the balance line, such as: 0V, −0.5V, −1.0V, −1.5V, ..., −2.0V, −2.5V. An advantageous method is to set the balance line voltage to the negative of the voltage nearest a quarter of the source line voltage. Thus, the absolute value of the sum $V_{source} + 4*V_{bal}$ will never exceed 1 volt.

From Equation (7), it will be seen that the maximum absolute parasitic voltage shift on the pixel will be:

$$|\Delta V_{par}|_{max} = \frac{C_{source}}{C_{total}}(1 \text{ volt}) \qquad (13)$$

while in the absence of a balance line, the maximum parasitic voltage shift will be:

$$|\Delta V_{par}|_{max} = \frac{C_{source}}{C_{total}}(10 \text{ volt}) \qquad (14)$$

Use of the balance line in this manner reduces the maximum parasitic voltage from source and balance line coupling by a factor of ten at only a moderate cost in power consumption.

This scheme can be generalized to a number of methods and for a number of ratios of source line-to-pixel capacitance to balance line-to-pixel capacitance. There may be trade-offs between total display power requirements and the reduction of the maximum parasitic voltage shift on the pixel caused by source line coupling.

Before describing a balance line backplane of the present invention adapted for use with transmissive displays, a conventional backplane for use with such transmissive displays will first be described by way of comparison, with reference to FIG. 14.

Figure 14:
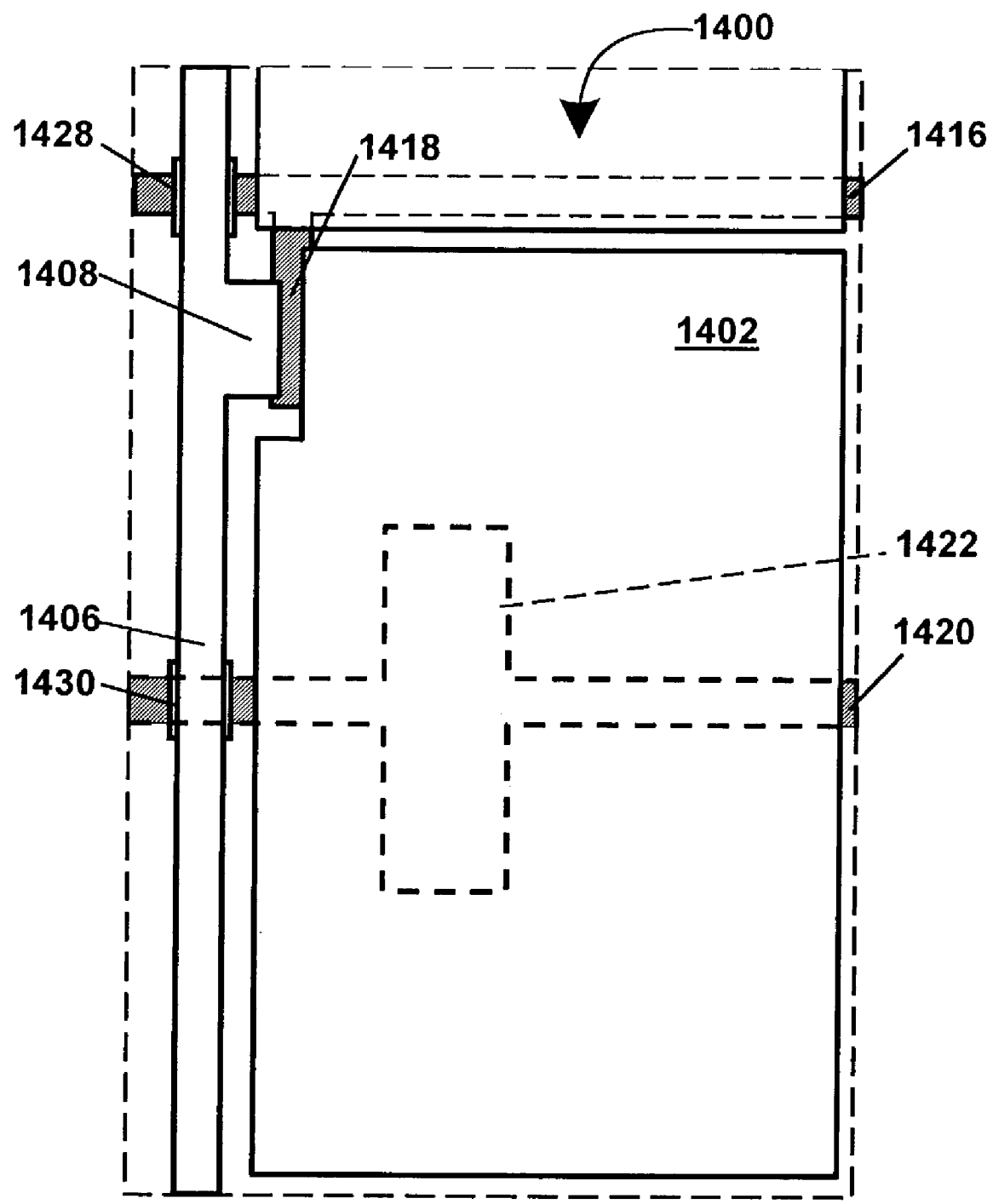
FIG. 14 is a top plan view, similar to that of FIG. 9A, of a typical TFT pixel unit of a transmissive active matrix prior art display.

FIG. 14 is a top plan view, similar to that of FIG. 9A, of a single typical TFT pixel unit of a transmissive display, which includes a pixel electrode 1402. The TFT (generally designated 1400) has a bottom gate structure and includes a second patterned conductive layer comprising a source line 1406; a source electrode 1408, which extends from the source line 1406; and a drain electrode (not shown) which lies beneath a pixel electrode 1402.

The TFT 1400 further includes a first patterned conductive layer, which includes: a select line 1416; a gate electrode 1418, which extends from the select line 1416; a capacitor line 1420 and a capacitor electrode 1422, which extends across the s capacitor line 1420. The TFT 1400 further includes an inter-metal bridge dielectric portion 1428 disposed between overlapping portions of the select line 1416 and the source line 1406, and another inter-metal bridge dielectric portion 1430 disposed between overlapping portions of the capacitor line 1420 and the source line 1406.

It will be noted from FIG. 14 that, since the source line 1406 and the pixel electrode 1402 lie in the same plane (the plane of FIG. 14), the capacitative coupling in the TFT 1400 is not between a source line and an overlying pixel electrode, but "laterally" between a source line and a pixel electrode in the same plane. In other words, in FIG. 9 the lines of force responsible for the source line/pixel electrode coupling extend "vertically" perpendicular to the plane of FIG. 9, whereas in FIG. 14 the lines of force responsible for the source line/pixel electrode coupling extend "horizontally" in the plane of FIG. 14.

Figure 15:
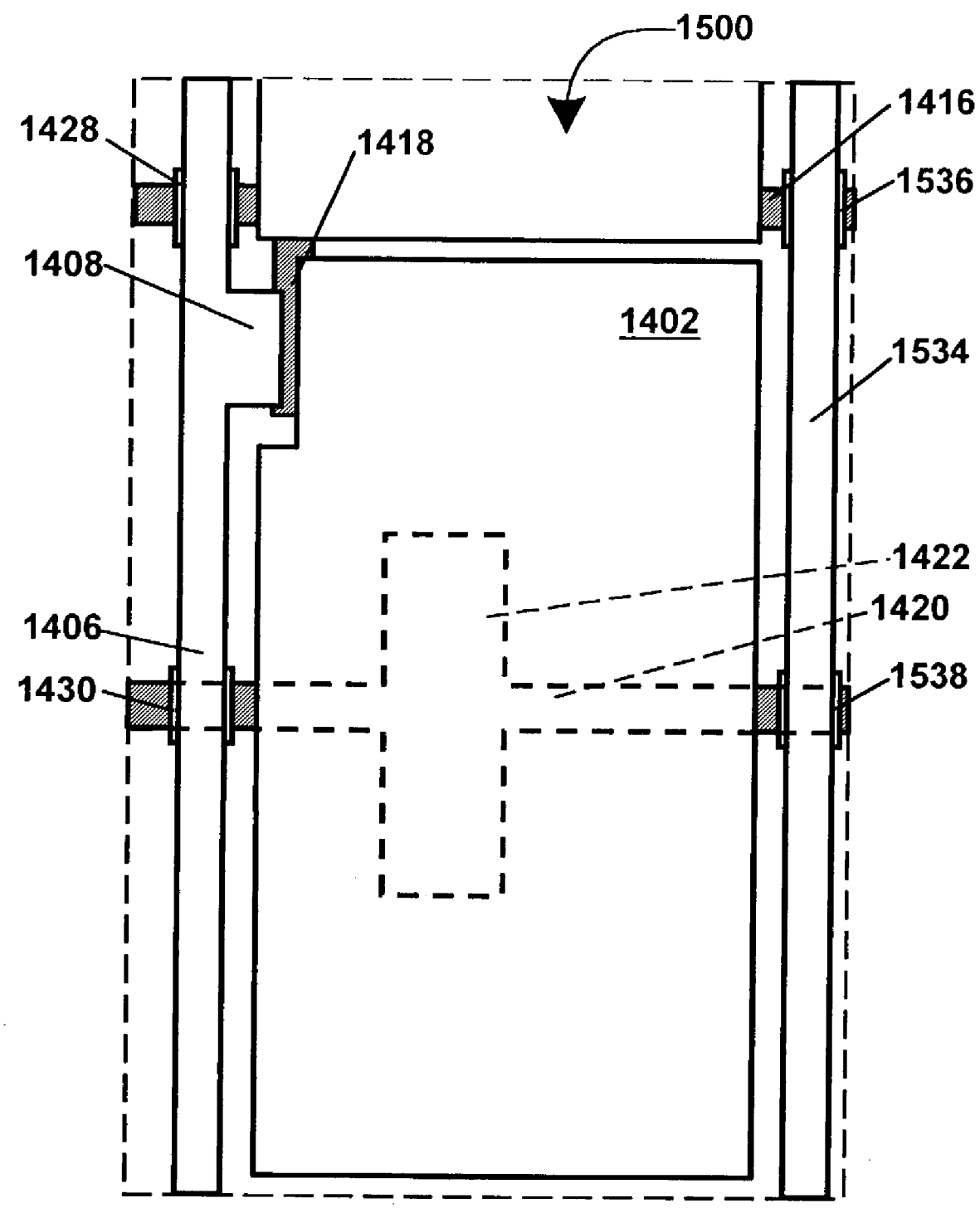
FIG. 15 is a top plan view, similar to that of FIG. 14, of a third balance line backplane of the present invention intended for use in a transmissive display.

FIG. 15 is a top plan view, similar to that of FIG. 14, of a single TFT pixel unit comprising one TFT (generally designated 1500) of a backplane which closely resembles the TFT 1400 already described with reference to FIG. 14, but which has a balance line in accordance with the present invention. Since most of the integers of the TFT 1500 are identical to the corresponding integers of the TFT 1400, they are given the same reference numerals and will not be further described. However, the TFT 1500 includes a balance line 1534, which runs parallel to the source line 1406, and inter-metal bridge dielectric portions 1536 and 1538, which are generally similar to the dielectric portions 1428 and 1430 respectively shown in FIG. 14, but are disposed between the overlapping portions of the balance line 1534 with the select line 1406 and the capacitor line 1420 respectively.

In the transmissive display shown in FIG. 15, the source lines 1406 lie in the same plane as the pixel electrode 1402. The balance line 1534 added adjacent each column of pixel electrodes 1402 lies in the same plane. Both the source line 1406 and balance line 1534 adjacent to each column of pixel electrodes 1402 have a capacitance with the pixel electrodes in that column. Using the schemes already described, voltages can be applied to the balance lines 1534 to reduce the maximum voltage shift on the pixel electrodes 1402 due to capacitative coupling of these pixel electrodes to the adjacent source lines, as compared with prior art backplanes not provided with balance lines.

Drivers for Balance Line Backplanes

The balance lines used in balance line backplanes of the present invention in practice need to be driven by drivers, as do the source lines. Provision of balance lines as described herein can double the number of source driver outputs which need to be fed to the active area of the display. Doubling the number of source driver outputs could mean that the cost of the source drivers increases considerably.

However, in practice the incremental cost of designing drivers to drive balance lines as well as source lines need not be large. For example, one can take advantage of the correlation between the voltages applied to a source line and that applied to its associated balance line. Typically, when a positive voltage is applied to a source line (assuming the top plane voltage to be zero), a negative voltage needs to be applied the associated balance line, and vice versa.

For example, an output to a particular source line could be chosen from two digital-to-analog converters (DAC's), one giving positive voltages and the other one that gives negative voltages. If the positive DAC is used to drive the source line then the negative DAC is available to drive the balance line and vice versa. In this way, one pair of DAC's (already often preferred in prior art displays not having balance lines) could be used to drive both a source line and its associated balance line. Additional costs for adding balance lines to a backplane may then be confined to those associated with routing circuitry from each of the two DAC's to the source and balance lines, and extra output pads for the balance lines. If the size of the driver is not pad limited, as may often be true for high-voltage drivers, then the additional output pads may not increase driver costs significantly.

FIGS. 16–20 illustrate preferred balance line drivers (i.e., drivers that drive both source and balance lines) of the present invention. These preferred drivers may be useful for driving the preferred balance line backplanes of the invention previously described.

Figure 16:
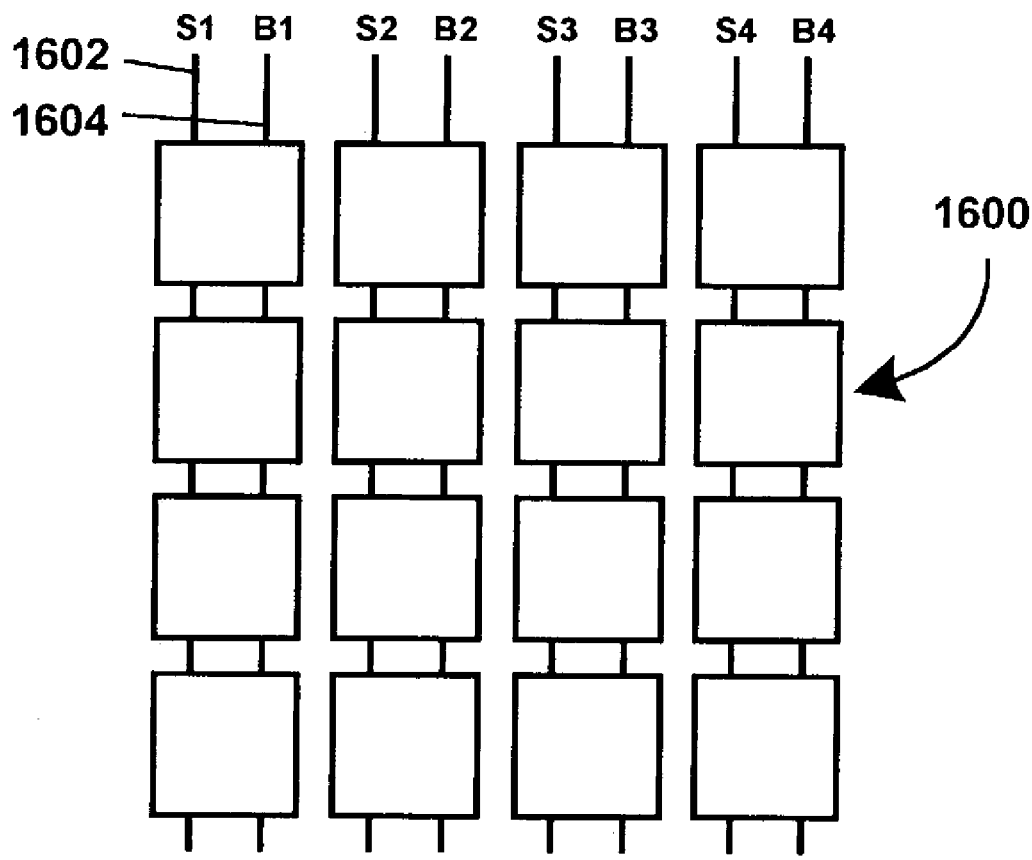
FIG. 16 is a block diagram of a portion of an active matrix balance line backplane of the present invention.

FIG. 16 is a schematic block diagram of a portion 1600 of an active matrix display having source lines 1602 and balance lines 1604. Every source line 1602 is associated (paired) with a balance line 1604.

As discussed above, preferred methods for driving balance lines typically require that a negative voltage be applied to a balance line whenever a positive voltage is applied to its associated source line, and that a positive voltage be applied to the balance line whenever a negative voltage is applied to its associated source line. For example, as discussed above with reference to FIG. 12, if the source and balance lines have the same capacitances to pixel electrodes in their column, the balance line voltage will be the inverse of the source line voltage.

Some preferred balance line drivers, which drive both source and balance lines, use the same digital-to-analog converter (DAC) at the driver output stage to drive each source and balance line pair. Some drivers of this type will be described with reference to FIGS. 18–20.

Figure 17:
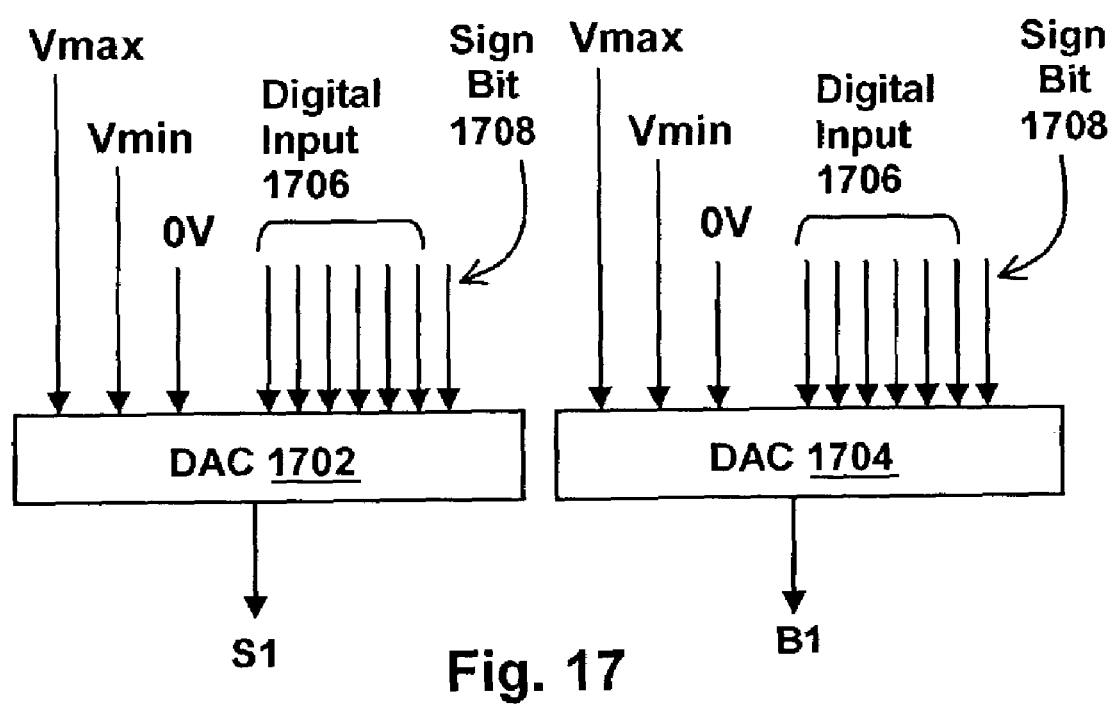
FIG. 17 is a schematic block diagram of a first driver of the present invention which can be used to drive the active matrix balance line backplane shown in FIG. 16.

FIG. 17 is a schematic block diagram of a portion of a driver, which includes two output DAC's 1702, 1704, and does not provide for output sharing. Two voltage rails, and optionally more intermediate voltages such as zero volts, are fed into each DAC 1702, 1704, along with the digital representation 1706 of the magnitude of voltage required on the source line 1604 (FIG. 16), and a sign bit 1708 indicating the polarity required for this voltage. For convenience, the top plane voltage is assumed to be zero volts, and the minimum and maximum output voltages are referred to as $V_{min}$ and $V_{max}$. $V_{min}$ is less than zero and $V_{max}$ is greater than zero. For every source and balance line 1602, 1604, an output DAC can be required, so the incremental driver cost of driving balance lines 1604 can be substantial.

The DAC 1702 supplies a voltage between $V_{min}$ and $V_{max}$ to the first source line, while the DAC 1702 supplies another voltage between $V_{min}$ and $V_{max}$ to the first balance line. This scheme is repeated for each source and balance line 1602, 1604.

Figure 18:
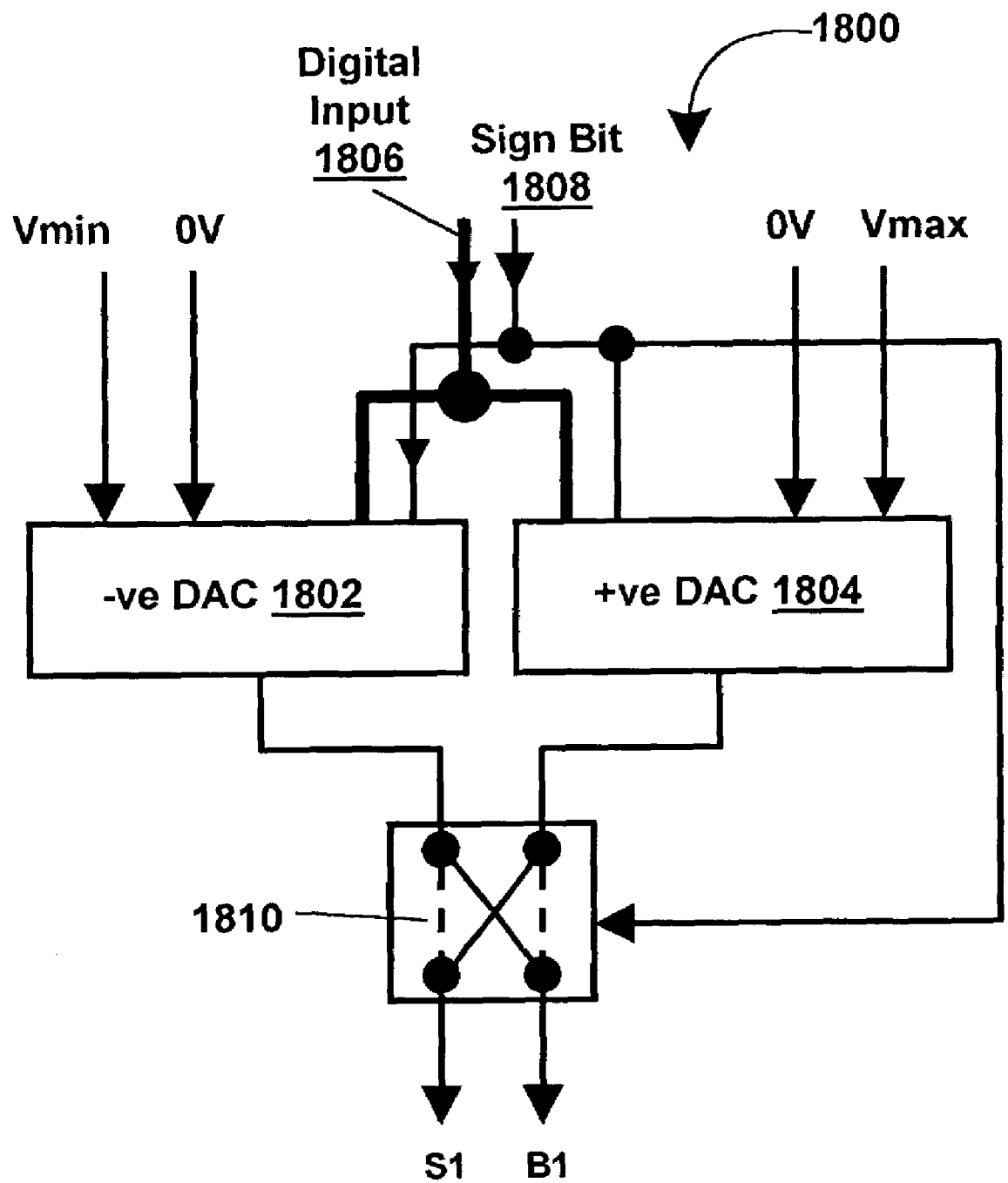
FIG. 18 is a schematic block diagram, generally similar to that of FIG. 17, of a second driver of the present invention which uses positive and negative output digital/analogue converters.

FIG. 18 a block diagram of a portion of a second driver (generally designated 1800) of the present invention that uses output DAC sharing. The driver 1800 includes one output DAC that is split into two half-range DAC's, namely a negative output DAC 1802 and a positive output DAC 1804. Each of these half-range DAC's 1802, 1804 has a first input which receives an n-bit digital voltage signal 1806 representative of the magnitude of the voltage to be applied to a source line S1, and a second input which receives a sign bit 1808 representative of the polarity of the voltage to be applied to the source line S1. Each of these half-range DAC's 1802, 1804 also has an input which receives 0 V, and a further input which receives one of the minimum and maximum output voltages; as shown in FIG. 18, the negative output DAC 1802 received the minimum output voltage $V_{min}$, while the positive output DAC 1804 receives the maximum output voltage $V_{max}$. Each of the DAC's 1802, 1804 has a single output, these outputs being connected to separate inputs of a reversing switch 1810, this switch 1810 having two outputs which are connected respectively to an associated pair of source and balance lines S1 and B1. The reversing switch 1810 has a first position, in which the output from DAC 1802 is connected to S1 and the output from DAC 1804 is connected to B1, and a second position, in which the output from DAC 1802 is connected to B1 and the output from DAC 1804 is connected to S1. The position of the switch 1810 is controlled by the sign bit 1808 which is fed to a third input of the switch 1810.

As will readily be apparent to those skilled in electronics, the DAC 1802 outputs negative voltages, and the DAC 1804 outputs positive voltages. The DAC's 1802, 1804 receive the digital voltage signal 1806, and provide the prescribed negative and positive voltages, respectively. The two outputs from the DAC's 1802 and 1804 are routed to the source and balance lines S1 and B1 through the switch 1810, which sends the positive output voltage from DAC 1804 to the source line S1 if the sign bit is set accordingly, and the negative output voltage from DAC 1802 to the corresponding balance line B1. If the sign bit is reversed, then the positive voltage is sent to the balance line B1 and the negative voltage to the source line S1.

Figure 19:
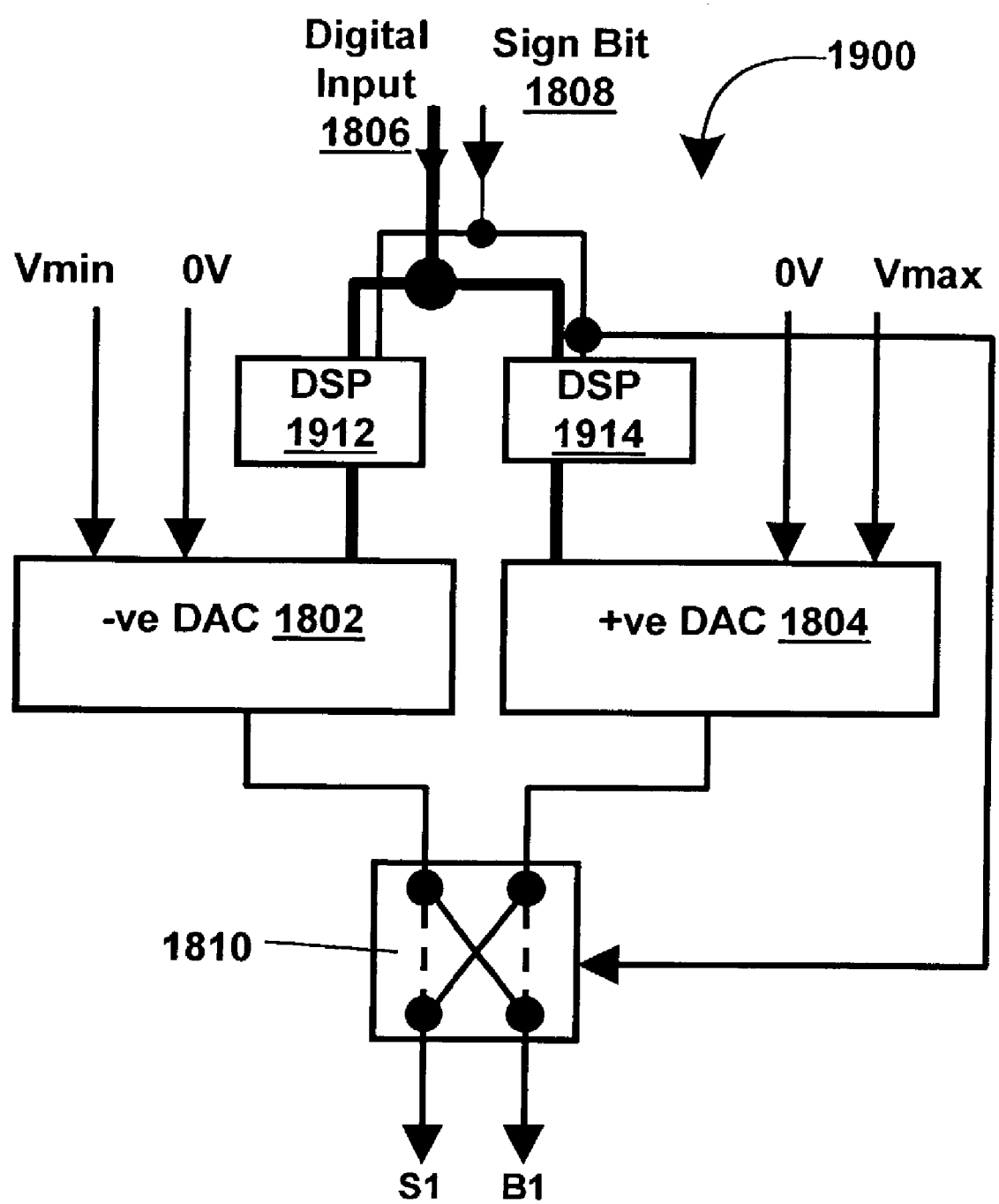
FIG. 19 is a schematic block diagram, generally similar to that of FIG. 18, of a third driver of the present invention which uses digital processors.

FIG. 19 is a block diagram, similar to that of FIG. 18, of a portion of a third driver (generally designated 1900) of the present invention, which closely resembles the second driver 1800 shown in FIG. 18. Since most of the components of the driver 1900 are identical to the corresponding components of the driver 1800, the components of driver 1900 are simply given the same reference numerals and will not be further described. However, the driver 1900 comprises two separate digital processors 1912 and 1914, which are interposed between the source of the digital voltage signal 1806 and the first inputs of DAC's 1802 and 1804 respectively. The digital processors 1912 and 1914 allow the balance line B1 to receive a voltage determined by a mapping of a source line voltage, this mapping being controlled by software contained in the processors 1912 and 1914.

As already indicated, the digital voltage signal 1806 is sent to inputs of the digital processors 1912 and 1914, which also receive the sign bit 1808. Suppose that a sign bit of zero indicates that a negative voltage is to be sent to the source line S1, and a sign bit of one indicates that a positive voltage is to be sent to the source line S1. The processor 1912 outputs the n-bit digital voltage signal 1806 if the sign bit 1808 is zero. If the sign bit 1808 is set to 1, the processor 1912 outputs a modified digital voltage appropriate for the mapping of balance line voltages to source line voltages.

The processor 1914 operates in a similar way but with the complement of the sign bit 1808. If the sign bit is zero, the processor 1914 outputs the digital voltage signal 1806. If the sign bit is set to 1, the processor 1914 outputs a modified digital voltage appropriate for the mapping of balance line voltages to source line voltages.

Figure 20:
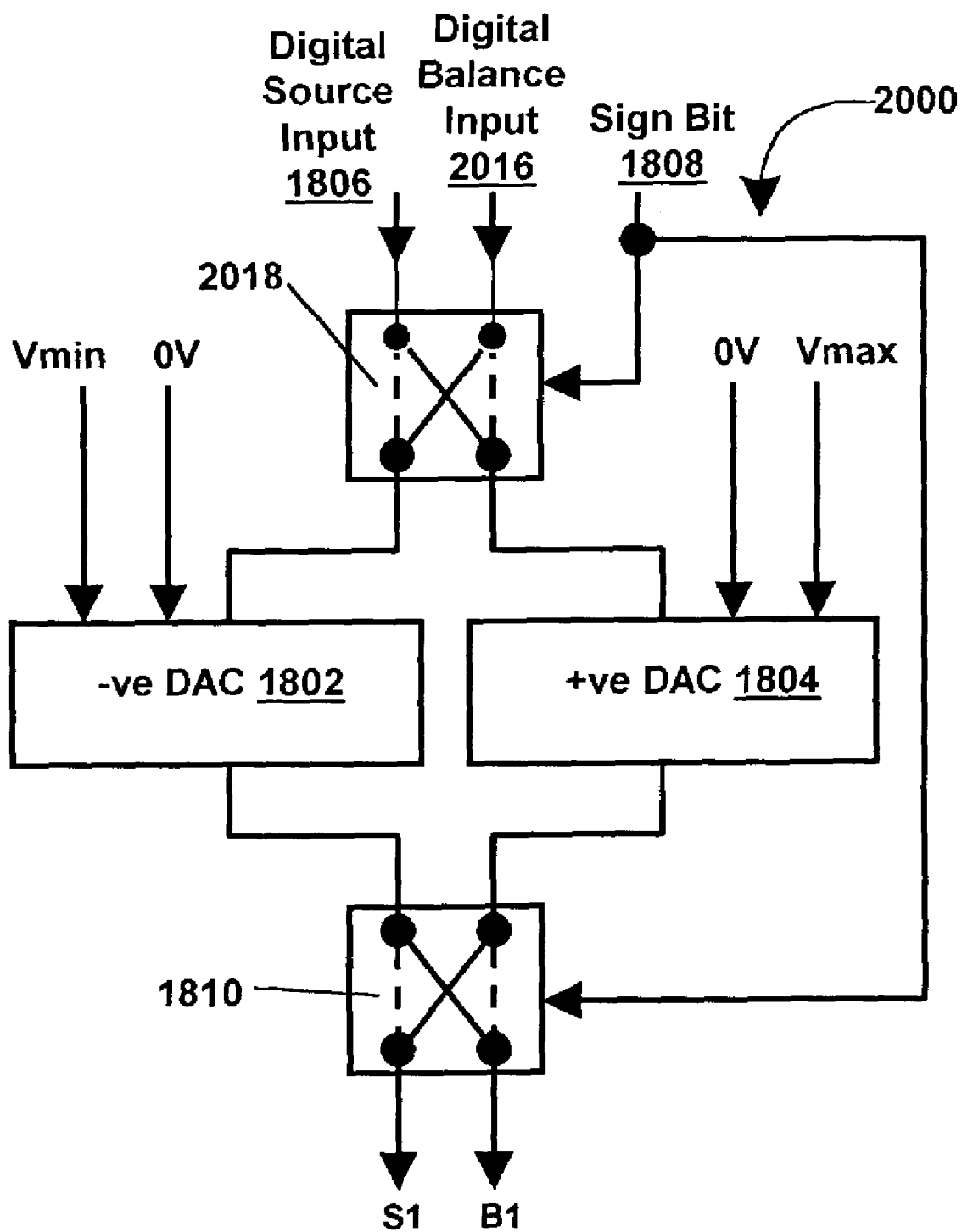
FIG. 20 is a schematic block diagram, generally similar to that of FIG. 19, of a fourth driver of the present invention which allows for separate source line and balance line inputs.

FIG. 20 is a block diagram, similar to those of FIGS. 18 and 19, of a portion of a fourth driver (generally designated 2000) of the present invention. The driver 2000 includes DAC's 1802 and 1804, a reversing switch 1810 and sources of a digital voltage signal 1806 and a sign bit 1808, all of which are essentially identical to the corresponding components of the drivers 1800 and 1900 already described. However, the driver 2000 is designed to allow for separate input signals specifying the magnitudes of the voltages to be applied to the source and balance lines S1 and B1 respectively.

For this purpose, the driver 2000 is arranged to receive a digital balance line signal 2016. The digital source and balance line signals 1806 and 2016 are fed to separate inputs of an input reversing switch 2018, which has two separate outputs connected to inputs of DAC's 1802 and 1804. This switch 2018 has a first position, in which the source voltage signal 1808 is connected to DAC 1802 and the balance voltage signal 2016 to DAC 1804, and a second position in which these connections are reversed. The position of reversing switch 2018 is controlled by the sign bit 1808.

If the sign bit is set for a negative source line voltage, the reversing switch 2018 is set to its first position, so that the source line voltage signal 1806 is passed to the negative output DAC 1802. In this case, the (output) reversing switch 1810 is also set to its first position, so that the output from negative output DAC 1802 is sent to the source line S1. Correspondingly, in this case, the balance line voltage signal 2016 is sent to the positive output DAC 1804, and the output from this positive output DAC 1804 is routed by output reversing switch 1810 to the balance line B1.

Obviously if the sign bit is set to its other value, indicating a positive source line voltage, both the reversing switches 2018 and 1810 are set to their second positions, so that the source line voltage signal 1806 is passed to the positive output DAC 1804, and the output from this DAC 1804 is sent by the switch 1810 to the source line S1, while the balance line voltage signal 2016 is passed to the negative output DAC 1802, and the output from this DAC 1802 is passed to the balance line B1.

While the invention has been particularly shown and described with reference to specific preferred embodiments, it should be understood by those skilled in the art that various changes in form and detail may be made therein without departing from the spirit and scope of the invention as defined by the appended claims. For example, an array of active or passive elements can be prepared in accordance with the present invention. Such an array can be used with any of the electro-optic media previously described, and may also be useful in devices other than electro-optic displays.

The invention claimed is:

1. A backplane for an electro-optic display, the backplane comprising a source line, a transistor and a pixel electrode connected to the source line via the transistor, the pixel electrode extending over part of the source line to form an overlap area, the backplane further comprising a conductive portion disposed between the source line and the pixel electrode, said conductive portion reducing the source line/pixel electrode capacitance.

2. A backplane according to claim 1 wherein the conductive portion extends over at least about 30 per cent of the overlap area.

3. A backplane according to claim 1 wherein the conductive portion extends over at least about 80 per cent of the overlap area.

4. A backplane according to claim 1 wherein the conductive portion extends over at least about 90 per cent of the overlap area.

5. A backplane according to claim 1 further comprising a capacitor electrode which forms a capacitor with at least one of the pixel electrode and the electrode of the transistor connected directly to the pixel electrode, the conductive portion being connected to the capacitor electrode.

6. A backplane according to claim 5 wherein the drain electrode of the transistor is connected to the pixel electrode, the backplane further comprising a layer of dielectric disposed between the drain electrode and the pixel electrode, and a conductive via extending from the drain electrode to the pixel electrode through the layer of dielectric, the capacitor electrode forming the capacitor with the drain electrode.

7. An electro-optic display comprising a backplane according to claim 1, a layer of electro-optic medium disposed on the backplane and covering the pixel electrode, and a front electrode disposed on the opposed side of the layer of electro-optic medium from the pixel electrode.

8. An electro-optic display comprising a backplane comprising a source line, a transistor and a pixel electrode connected to the source line via the transistor, the pixel electrode extending over part of the source line to form an overlap area, the backplane further comprising a conductive portion disposed between the source line and the pixel electrode, said conductive portion reducing the source line/pixel electrode capacitance, wherein the electro-optic medium is a rotating bichromal member or electrochromic medium.

9. An electro-optic display comprising a backplane comprising a source line, a transistor and a pixel electrode connected to the source line via the transistor, the pixel electrode extending over part of the source line to form an overlap area, the backplane further comprising a conductive portion disposed between the source line and the pixel electrode, said conductive portion reducing the source line/pixel electrode capacitance, wherein the electro-optic medium is an electrophoretic medium.

10. An electro-optic display according to claim 9 wherein the electro-optic medium is an encapsulated electrophoretic medium.

11. A backplane for an electro-optic display, the display comprising a plurality of pixels arranged in a two-dimensional array of rows and columns such that any specific pixel is uniquely defined by the intersection of one specified row and one specified column, each pixel of the display having a pixel electrode and an associated transistor, the pixel electrode being connected to the drain electrode of the associated transistor, the display further comprising a plurality of source electrodes and a plurality of row electrodes, such that the source electrodes of all the transistors in one column of the array are connected to a single column electrode, and the gate electrodes of all the transistors in one row of the array are connected to a single row electrode, at least one of the pixel electrode extending over part of one source line to form an overlap area, the backplane further comprising a conductive portion disposed between the source line and the pixel electrode in the overlap area, said conductive portion reducing the source line/pixel electrode capacitance.

12. A backplane according to claim 11 wherein the conductive portion extends over at least about 30 per cent of the overlap area.

13. A backplane according to claim 11 wherein the conductive portion extends over at least about 80 per cent of the overlap area.

14. A backplane according to claim 11 wherein the conductive portion extends over at least about 90 per cent of the overlap area.

15. A backplane according to claim 11 further comprising a capacitor electrode which forms a capacitor with at least one of said at least one pixel electrode and the drain electrode of its associated transistor, the conductive portion being connected to the capacitor electrode.

16. A backplane according to claim 15 further comprising a layer of dielectric disposed between each drain electrode and its associated pixel electrode, and a conductive via extending from the drain electrode to the pixel electrode through the layer of dielectric, the capacitor electrode forming the capacitor with the drain electrode.

17. An electro-optic display comprising a backplane according to claim 11, a layer of electro-optic medium disposed on the backplane and covering the pixel electrodes, and a front electrode disposed on the opposed side of the layer of electro-optic medium from the pixel electrodes.

18. An electro-optic display according to claim 17 wherein the electro-optic medium is a rotating bichromal member or electrochromic medium.

19. An electro-optic display according to claim 17 wherein the electro-optic medium is an electrophoretic medium.

20. An electro-optic display according to claim 19 wherein the electro-optic medium is an encapsulated electrophoretic medium.

* * * * *

UNITED STATES PATENT AND TRADEMARK OFFICE
CERTIFICATE OF CORRECTION

PATENT NO. : 7,116,318 B2 Page 1 of 1
APPLICATION NO. : 10/249618
DATED : October 3, 2006
INVENTOR(S) : Amundson et al.

It is certified that error appears in the above-identified patent and that said Letters Patent is hereby corrected as shown below:

On the Title Page:

Replace the entire Section beginning Item "(75) Inventors:" with the following:

Item --(75) Inventor: Karl R. Amundson, Cambridge, MA (US)--

Signed and Sealed this

Second Day of September, 2008

JON W. DUDAS
*Director of the United States Patent and Trademark Office*